(12) United States Patent
Zebarjadi et al.

(10) Patent No.: US 9,076,712 B2
(45) Date of Patent: Jul. 7, 2015

(54) SOLID STATE CLOAKING FOR ELECTRICAL CHARGE CARRIER MOBILITY CONTROL

(71) Applicant: Massachusetts Institute of Technology, Cambridge, MA (US)

(72) Inventors: Mona Zebarjadi, East Brunswick, NJ (US); Bolin Liao, Cambridge, MA (US); Keivan Esfarjani, East Brunswick, NJ (US); Gang Chen, Carlisle, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/017,421

(22) Filed: Sep. 4, 2013

(65) Prior Publication Data
US 2014/0070167 A1 Mar. 13, 2014

Related U.S. Application Data

(60) Provisional application No. 61/696,415, filed on Sep. 4, 2012.

(51) Int. Cl.
*H01L 29/15* (2006.01)
*H01L 29/66* (2006.01)
(Continued)

(52) U.S. Cl.
CPC ........ *H01L 29/158* (2013.01); *H01L 29/66977* (2013.01); *H01L 29/7727* (2013.01);
(Continued)

(58) Field of Classification Search
CPC ......... H01L 35/34; H01L 35/14; H01L 35/03; H01L 35/26; H01L 29/158; H01L 29/66977; H01L 29/7727; H01L 29/7786; H01L 29/122; H01L 29/1606; H01L 29/1075; B82Y 10/00

USPC ................. 257/22, 439; 252/500, 513, 518.1; 136/200, 203, 305; 977/932, 953, 955
See application file for complete search history.

(56) References Cited

U.S. PATENT DOCUMENTS 5,412,231 A * 5/1995 Furuya .......................... 257/192
5,856,681 A   1/1999 Ohshima
(Continued)

FOREIGN PATENT DOCUMENTS

EP      0553807 A1    4/1993

OTHER PUBLICATIONS

Heremans et al., "Enhancement of Thermoelectric Efficiency in PbTe by Distortion of the Electron Density of States", 2008, Science, vol. 321, pp. 554-557, published on Jul. 25, 2008); Supporting Online Material for "Enhancement of Thermoelectric Efficiency in PbTe by Distortion of the Electron Density of States".*

(Continued)

*Primary Examiner* — Nikolay Yushin
(74) *Attorney, Agent, or Firm* — Theresa A. Lober

(57) ABSTRACT

An electrical mobility-controlled material includes a solid state host material having a controllable Fermi energy level and electrical charge carriers with a charge carrier mobility. At least one Fermi level energy at which a peak in charge carrier mobility is to occur is prespecified for the host material. A plurality of particles are distributed in the host material, with at least one particle disposed with an effective mass and a radius that minimize scattering of the electrical charge carriers for the at least one prespecified Fermi level energy of peak charge carrier mobility. The minimized scattering of electrical charge carriers produces the peak charge carrier mobility only at the at least one prespecified Fermi level energy, set by the particle effective mass and radius, the charge carrier mobility being less than the peak charge carrier mobility at Fermi level energies other than the at least one prespecified Fermi level energy.

52 Claims, 12 Drawing Sheets

(51) Int. Cl.
    *H01L 29/772*     (2006.01)
    *H01L 29/778*     (2006.01)
    *H01L 29/12*      (2006.01)
    *H01L 29/16*      (2006.01)
    *B82Y 10/00*      (2011.01)
    *H01L 29/10*      (2006.01)

(52) U.S. Cl.
    CPC ......... *H01L29/7786* (2013.01); *H01L 29/1075* (2013.01); *H01L 29/122* (2013.01); *H01L 29/1606* (2013.01); *B82Y 10/00* (2013.01)

(56) References Cited

U.S. PATENT DOCUMENTS

| | | | | |
|---|---|---|---|---|
| 6,627,809 | B1* | 9/2003 | Koga et al. | 136/236.1 |
| 7,390,568 | B2* | 6/2008 | Kim et al. | 428/403 |
| 7,465,871 | B2* | 12/2008 | Chen et al. | 136/236.1 |
| 7,825,405 | B2* | 11/2010 | Kim et al. | 257/40 |
| 2005/0284512 | A1* | 12/2005 | Heremans et al. | 136/236.1 |
| 2006/0102224 | A1* | 5/2006 | Chen et al. | 136/203 |
| 2008/0001127 | A1* | 1/2008 | Zide et al. | 252/521.1 |
| 2010/0193003 | A1* | 8/2010 | Lee et al. | 136/239 |
| 2011/0212561 | A1* | 9/2011 | Banin et al. | 438/47 |
| 2011/0248210 | A1* | 10/2011 | Willigan et al. | 252/71 |

OTHER PUBLICATIONS

Dahlquist et al. "Cyclotron Resonance in Thallium", 1967, Phys. Rev., vol. 164, No. 3, pp. 944 951, Dec. 15, 1967.*

Bubnova et al., "Optimization of the thermoelectric figure of merit in the conductive polymer poly(3,4-ethylenedioxyophene)", 2011, Nature Materials, vol. 10, pp. 429-433, published Jun. 2011.*

Li et al., High-performance nanostructure thermoelectric materials, 201, NPG Asia Materials, vol. 2, pp. 152-158, published Oct. 2010.*

Ohta et al., Giant thermoelectric Seebeck coefficient of a two-dimensional electron gas in SrTiO3, 2007, Nature Materials, vol. 6, pp. 129-134, published on Jan. 21, 2007.*

Tang et al., "Holey Silicon as an Efficient Thermoelectric Material", 2010, NANOletters, vol. 10, pp. 4279-4283, published on Sep. 14, 2010.*

Fujita et al., Experimental Verification of the Mott Relation in the Thermoelectric Effect of the Quantum Hall System, 2011, AIP Conf. Proc., Physics of Semiconductors, vol. 1399, pp. 623-624; published on Jan. 25, 2012.*

Gabor et al., "Hot Carrier-Assisted Intrinsic Photoresponse in Graphene", 2011, Science, vol. 334, pp. 648-652, published on Nov. 4, 2011.*

Jaworski et al., "Thermoelectric transport properties of the n-type impurity Al in PbTe", 2012, Physical Review, vol. B85, pp. 033204-1-033204-3, published on Jan. 23, 2012.*

Kong, "Thermoelectric Property Studies on Lead Chalcogenides, Double-filled Cobalt Tri-Antimonide and Rare Earth-Ruthenium-Germanium", 2008, Dissertation, the University of Michigan, pp. 1-128, published Dec. 2008.*

Kim et al., "On the effective plate thickness of monolayer graphene from flexural wave propagation", 2011, Journal of Applied Physics, vol. 110, pp. 054324-1-054324-6, published on Sep. 15, 2011.*

Nakano et al., "Soft Synthesis of Single-Crystal Silicon Monolayer Sheets", Angew. Chem. Int., 2006, vol. 45, pp. 6303-6306, published on Sep. 25, 2006.*

PCT/US2013/057922, Written Opinion of the International Searching Authority, Form PCT/ISA/220, Form PCT/ISA/237 Separate Sheet Sheets 1-6, Oct. 2013.

PCT/US2013/057922, International Search Report, First sheet, Continuation of First Sheet, Second sheet, and patent family annex, Oct. 2013.

Liao, "Practical Electron Cloaking in Solids," Master of Science in Mechanical Engineering Thesis, Massachusetts Institute of Technology, Cambridge, Massachusetts, pp. 1-72, Oct. 22, 2012.

Liao et al., "Cloaking Core-Shell Nanoparticles from Conducting Electrons in Solids," Physical Review Letters, vol. 109, pp. 126806-1-126806-5, Sep. 20, 2012.

Liao et al., "Simultaneous Enhancement of Thermoelectric Properties with "Invisible" dopants," MIT Mechanical Engineering Micro/Nano Seminar, Massachusetts Institute of Technology, Cambridge, Massachusetts, Feb. 27, 2013.

Zebarjadi et al., "Enhancing the Thermoelectric Power Factor by Using Invisible Dopants," Advanced Materials, vol. 25, No. 11, pp. 1577-1582, Jan. 2013.

Zebarjadi et al., "Effect of nanoparticle scattering on thermoelectric power factor," Applied Physics Letters, vol. 94, pp. 202105-1-202105-3, May 2009.

Bahk et al., "Thermoelectric Power Factor Enhancement by Ionized Nanoparticle Scattering," Applied Physics Letters, vol. 99, pp. 072118-1-072118-3, Aug. 2011.

Zebarjadi et al., Low-Temperature Thermoelectric Power Factor Enchancement by Controlling Nanoparticle Size Distribution, Nano Letters, vol. 11, pp. 225-230, Dec. 2010.

* cited by examiner

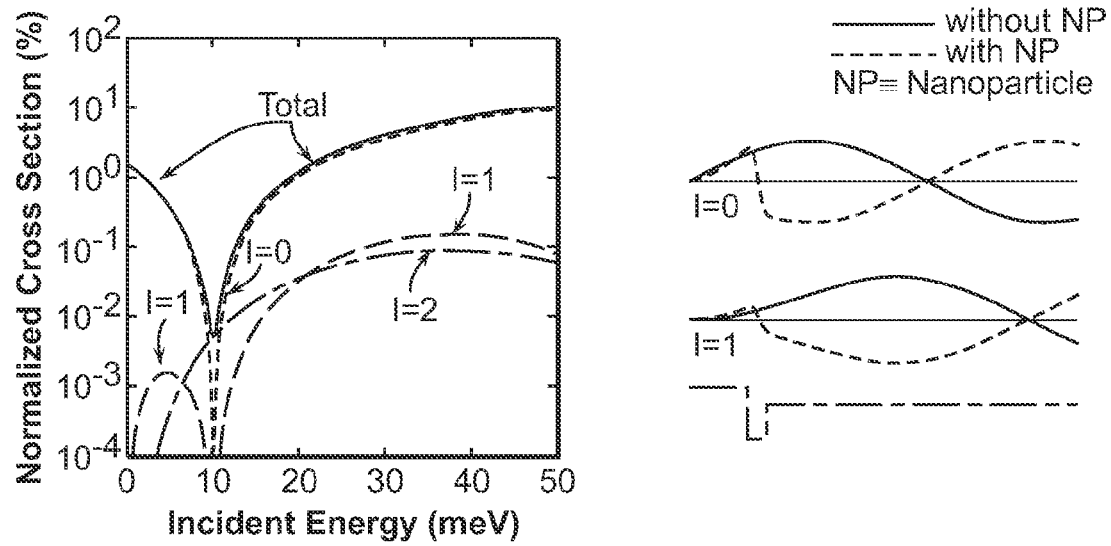
FIG. 3A
FIG. 3B
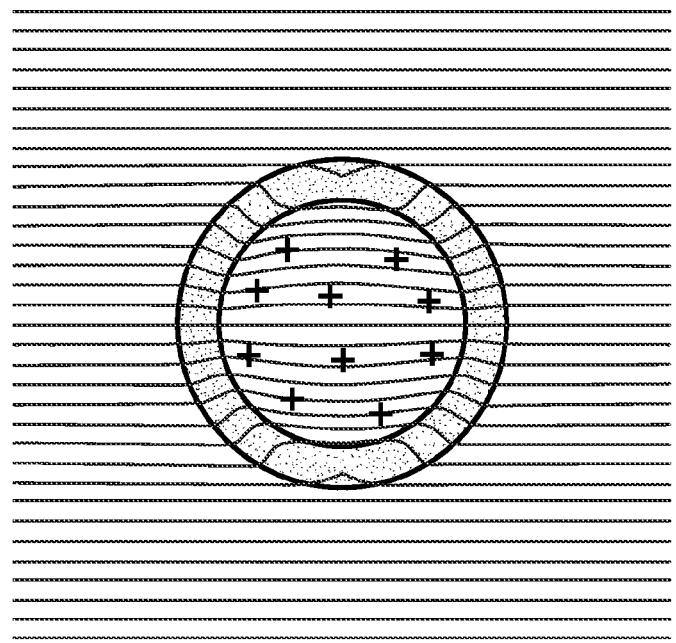
FIG. 4

——— $V_1$
- - - - $|V_2|$

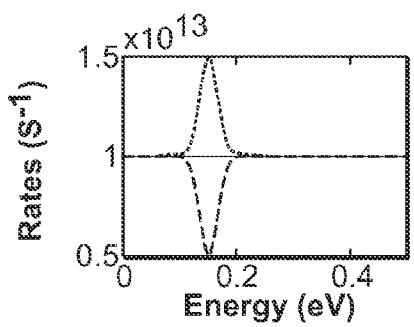
FIG. 7A
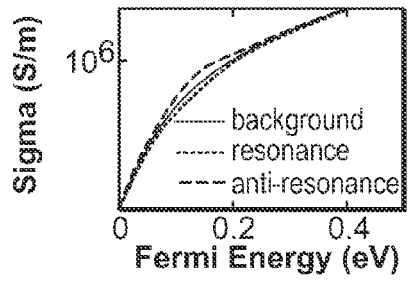
FIG. 7B
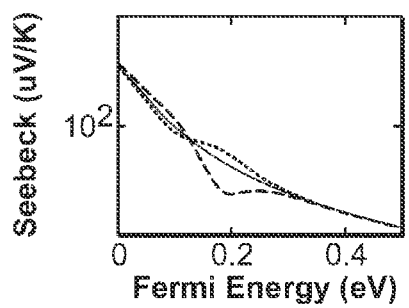
FIG. 7C
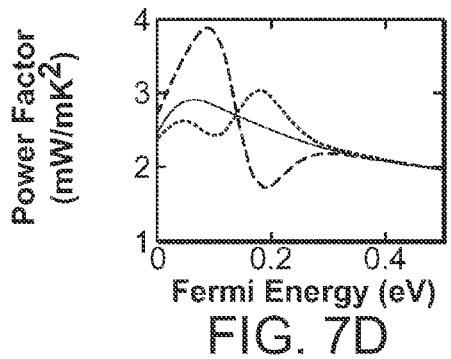
FIG. 7D
FIG. 8A
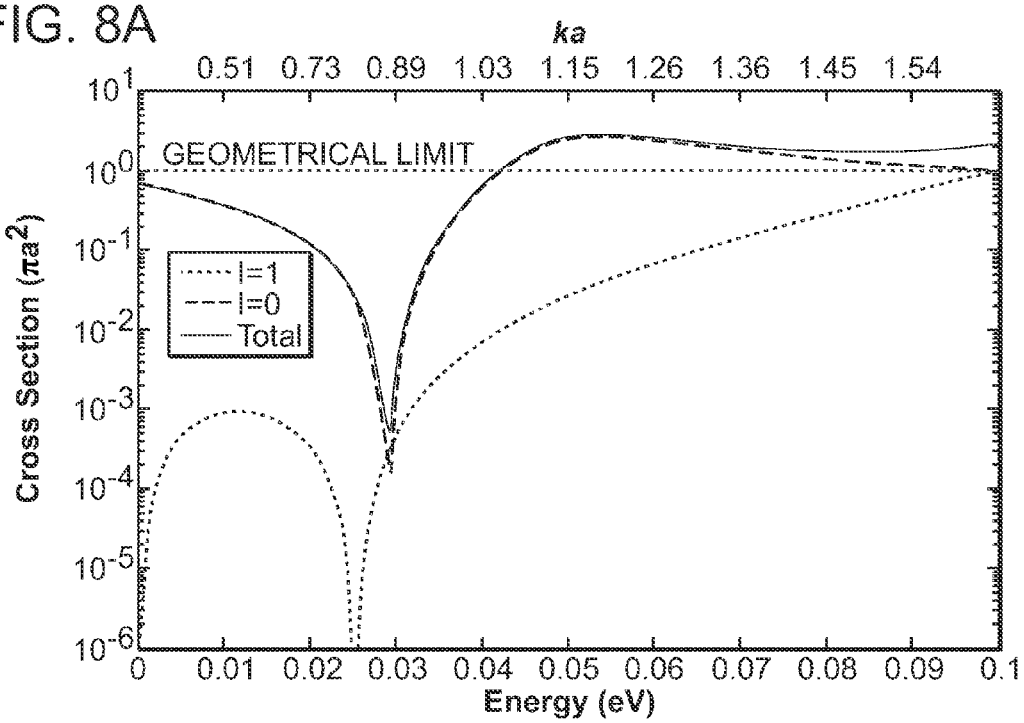
FIG. 8B
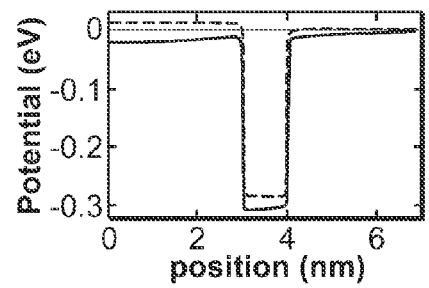

SOLID STATE CLOAKING FOR ELECTRICAL CHARGE CARRIER MOBILITY CONTROL

CROSS-REFERENCE TO RELATED APPLICATIONS

This application claims the benefit of U.S. Provisional Application No. 61/696,415, filed Sep. 4, 2012, the entirety of which is hereby incorporated by reference.

STATEMENT REGARDING FEDERALLY SPONSORED RESEARCH

This invention was made with Government support under Contract No. DE-FG02-09ER46577, awarded by the Department of Energy; and under Contract No. FA9550-10-1-0533, awarded by the Air Force. The Government has certain rights in the invention.

BACKGROUND

This invention relates generally to electrical current conduction in solid state materials, and more particularly relates to techniques for manipulating the mobility of free electrical charge carriers, for controllably increasing or decreasing electrical current conduction in solid state materials.

Electrical current conduction in a solid state material such as a semiconducting material is by free electrical charge carriers, holes and electrons, which are either intrinsic to the material or are donated to the material. Charge carriers can be donated to a solid state material by, e.g., adding impurity atoms the material, by the process of doping. The number of free carriers in the matrix of a host material can then be controlled by the concentration of the impurity atoms. Whether the free electrical charge carriers are intrinsic or donated to a material, the electrical conductivity of the material is proportional to the product of the electrical charge carrier concentration and the mobility of the electrical charge carriers. Carrier mobility characterizes how fast an electrical charge carrier can move through a solid state material, and depends on the number of scattering centers present in the solid state material as well as the interaction potential of those scattering centers with the electrical charge carriers.

Charge carrier mobility is an important characteristic for a wide range of solid state materials, and particularly for solid state semiconducting materials. Increased charge carrier mobility is for many applications desired for enabling an increase in electrical conductivity in semiconductor devices. The achievement of increased charge carrier mobility, and indeed the controlled manipulation of charge carrier mobility in general, provides improved semiconductor device performance and enables a wide range of semiconductor devices and systems.

SUMMARY

There is provided an electrical mobility-controlled material. The mobility-controlled material includes a solid state host material having a controllable Fermi energy level and having electrical charge carriers with a charge carrier mobility in the host material. At least one Fermi level energy at which a peak in charge carrier mobility is to occur is prespecified for the host material. A plurality of particles are distributed in the host material. At least one particle in the plurality of particles is disposed with an effective mass and a radius that minimize scattering of the electrical charge carriers for the at least one prespecified Fermi level energy of peak charge carrier mobility in the host material, as the charge carriers conduct through the host material. The minimized scattering of electrical charge carriers produces the peak charge carrier mobility only at the at least one prespecified Fermi level energy, set by the at least one particle effective mass and radius, with the charge carrier mobility being less than the peak charge carrier mobility at Fermi level energies other than the at least one prespecified Fermi level energy.

There is further provided an electrical mobility-controlled material. The mobility controlled material here includes a solid state host material having a thickness less than about 100 nm. The host material has a controllable Fermi energy level and has electrical charge carriers with a charge carrier mobility in the host material. At least one Fermi level energy at which a peak in charge carrier mobility is to occur is prespecified for the host material. At least one electrode is disposed on the host material. The electrode is connected to impose on the host material a voltage, $V_{min}$, that produces an electrostatic potential in the host material that minimizes scattering of the electrical charge carriers for the at least one prespecified Fermi level energy of the host material, as the charge carriers conduct through the host material. The minimized scattering of electrical charge carriers produces a peak charge carrier mobility only at the at least one prespecified Fermi level energy, set by the voltage, $V_{min}$, with the charge carrier mobility being less than the peak charge carrier mobility at Fermi level energies other than the at least one prespecified Fermi level energy.

With these electrical mobility-controlled materials, there is provided the ability to control charge carrier mobility and correspondingly, conductance, through the materials. The total scattering cross section of conduction carriers, off of particles in the host material, for example, can be tuned to a preselected incident charge carrier energy, corresponding to a preselected Fermi level energy. Particles in the host material can therefore be shielded, or cloaked, from conducting charge carriers. Alternatively, voltages can be applied to the host material to control the scattering cross section of conduction carriers in the host material.

A wide range of applications, including thermoelectrics, switches, filters, and indeed any electronic device in which charge carrier mobility impacts device performance, are well-addressed by the materials. Other features and advantages will be apparent from the following description and the accompanying drawings, and from the claims.

BRIEF DESCRIPTION OF THE DRAWINGS

FIG. 3A is a plot of total electron wave scattering cross section and contributions from the first three partial waves of an electron wave, as a function of energy, traveling through a host material in which is disposed the scattering center particle of FIG. 2A, for selected particle parameters;

FIG. 3B is a plot of the radial distribution functions of the $0^{th}$ order and $1^{st}$ order partial waves of an electron wave, with and without the presence of the core-shell scattering center particle of FIG. 2A; for the first two partial waves, showing the desired $\pi$ phase shifts;

FIG. 4 is a schematic plot of the probability flux associated with the scattered wave function of an electron wave traveling though a host material in which the core-shell scattering center particle of FIG. 2A is disposed;

FIG. 7A is a plot of scattering rate as a function of Fermi level energy for resonance scattering and for anti-resonance scattering;

FIGS. 7B-7D are plots of the electrical conductivity, Seebeck coefficient, and power factor, for the resonance and anti-resonance conditions of the plot of FIG. 7A;

FIG. 8A is a plot of the scattering cross section as a function of electron energy for the core-shell scattering center particle of FIG. 2A, for the first two partial waves and the total of their contributions, of an electron wave traveling in a host material in which the particle is disposed, for the particle parameters given for Z=1 in Table I;

FIG. 8B is a plot of the electrical potential of the scattering center particle for which the cross section is plotted in FIG. 8A, as a function of distance through the particle;

DETAILED DESCRIPTION

Figure 1A:
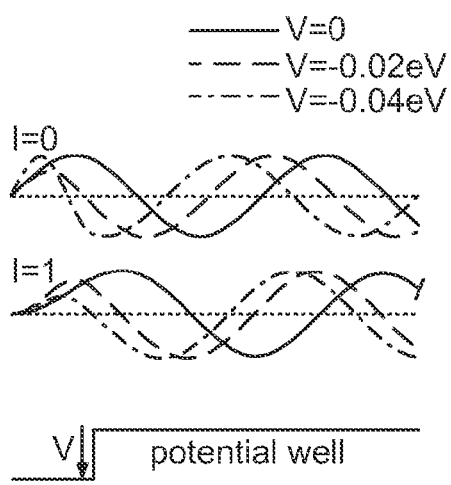
FIGS. 1A-1B are plots of the phase shift, for the first two partial waves of an electron wave, that is imposed by a potential well, and a potential barrier, respectively, in a three-dimensional host material in which the electron wave is traveling.

The mobility of free charge carriers in a solid state material depends on the number of scattering centers present in the solid state material and the interaction potential of those scattering centers with the electrical charge carriers during charge carrier transport, or electrical conduction. By engineering the interaction potential of scattering centers in a material so that the impact of the interaction potential on free charge carriers is minimized, electrical charge carrier transport is correspondingly enhanced. Herein are provided design methodologies and corresponding device structures that can cloak scattering centers in a solid state material, by reducing the impact of the interaction potential of the scattering centers on free charge carriers, thereby to enable enhanced free charge carrier transport in the solid state material.

One class of scattering centers that can be present in a solid state material, e.g., a semiconductor material, are electrical charge carrier dopant centers. Such dopant centers can be introduced to the solid state material provided as molecules, atoms, compounds, or other species, and can be organic, inorganic, naturally occurring, or engineered, e.g., as particles, mesoparticles, and/or nanoparticles. The dopant centers are intentionally added to the semiconducting material to provide a desired concentration of free electrical charge carriers that are donated to the material by the dopant centers, for achieving a desired electrical conductivity in the semiconducting material.

Electrical charge transport of free electrical charge carriers that are donated by dopant centers to a three-dimensional material solid state material, such as a semiconducting material, can be characterized by wave-like behavior, as effectively described by the Schrödinger equation in non-relativistic systems, and as described by the Dirac equation in relativistic systems. For a three-dimensional solid, partial wave formalism, based on the Schrödinger equation, provides a framework for considering the scattering properties of matter waves, such as electron waves, or hole waves, in an environment of scattering potentials, such as the scattering potentials produced by dopant centers that are present in a doped, three-dimensional material such as a semiconducting material. The discussion below refers to dopant centers as the scattering centers under consideration, but it is to be recognized that any species disposed in a three-dimensional solid that produces a scattering potential can be considered and controlled, as explained in detail below.

For clarity of discussion, electrical charge carriers that are electrons are considered, but this analysis is equally applicable to electrical charge carriers that are holes. In a three-dimensional solid, conducting electrons can be characterized by a corresponding electron matter wave that propagates through the three-dimensional solid during electron transport. Given a framework of electron matter wave interaction with scattering potentials, it is considered that the scattering potential of scattering centers in the solid can be assumed to be spherically symmetric and that the scattering potential is short-range, meaning that the only effect of the scattering potential on scattered matter wave states is to introduce a phase shift as the distance away from the scattering center approaches infinity. In this analysis, it is further assumed that the temperature of operation of the solid state material is sufficiently low that the electrical charge scattering from scattering centers dominates over other scattering mechanisms in the material.

This framework of electron matter wave interaction with scattering potentials further is based on a condition that the size of the scattering centers that produce the scattering potentials is no larger than, e.g., smaller than, or comparable to, the wavelength of the matter wave of the conducting electrons in the semiconducting material. This condition can be generalized for any charge carrier under consideration, and is specific to the material of interest. For example, the wavelength of the electron matter wave is directly dependent on the energy and the effective mass of the electron in a given material. This condition and its analysis are quantitatively demonstrated below.

Now, consider an incident plane electron matter wave propagating through a three-dimensional solid state material, along the z axis, and hitting a scattering center, such as a dopant center, in the material. The scattered electron wave approaches a spherical wave asymptotically when going far away from the scattering center, with an angle-dependent amplitude. Hence in radial coordinates, the wave function, $\Psi(r, \theta, \phi)$, for the electron matter wave at places far away from the scattering center takes a general form as:

$$\psi(r, \theta, \phi) = A\left[e^{ikz} + f(\theta, \phi)\frac{e^{ikr}}{r}\right] \quad (1)$$

where A is a normalization constant and $f(\theta, \phi)$ is the angular scattering amplitude. With this expression, the incident electron flux, $J_{in}$, in the unit of number per area per time, is given as:

$$J_{in} = |A|^2 \frac{\hbar k}{m}\hat{z}, \quad (2)$$

where $\hat{z}$ is the unit vector along z direction. Similarly the electron flux associated with the scattered wave, $J_{out}$, can be expressed as:

$$J_{out} = \frac{|A|^2 |f(\theta, \phi)|^2}{r^2} \frac{\hbar k}{m}\hat{r} \quad (3)$$

Thus the number of electrons, $P_{out}$, that are scattered into a differential solid angle, $d\Omega$, at a certain direction in radial coordinates $(\theta, \phi)$ in unit time is given as:

$$P_{out}(\theta, \phi) = |J_{out}|r^2 d\Omega = |A|^2 |f(\theta, \phi)|^2 \frac{\hbar k}{m} d\Omega \quad (4)$$

The differential scattering cross section, $\sigma(\Omega)d\Omega$, is defined as the ratio of the number of electrons scattered into a differential solid angle at certain direction per unit time to the incident particle flux, and hence is given in the units of area. Thus in this case the differential scattering cross section is given by:

$$\sigma(\Omega)d\Omega = \frac{P_{out}(\theta, \phi)}{|J_{out}|} = |f(\theta, \phi)|^2 d\Omega \quad (5)$$

The total scattering cross section, $\sigma_{tot}$, defined as the ratio of the total number of scattered electrons per unit time to the incident particle flux, is found by integrating $\sigma(\Omega)d\Omega$ over all the radial directions. For a spherically symmetrical scattering potential, the scattering event is cylindrically symmetrical around the incident axis and is not $\phi$-dependent. Thus the total scattering cross section, $\sigma_{tot}$, can be given as:

$$\sigma_{tot} = 2\pi\int_0^\pi |f(\theta)|^2 \sin\theta d\theta. \quad (6)$$

The next step in the design methodology is to find the scattering amplitude, $f(\theta)$, given the scattering potential. First consider the Schrödinger equation in spherical coordinates without any scattering potential. Due to the cylindrical symmetry of the problem around the incident axis, the general form of the eigenstates can be expanded in a series form as:

$$\psi(r, \theta) = \sum_{l=0}^{+\infty} c_l R_l(r) P_l(\cos\theta), \quad (7)$$

where $R_l(r)$ is the radial part of the wave function to be determined, $P_l$ is the associated Legendre polynomial of order l, and the constant $c_l$ is the expansion coefficient. Expressing the Schrödinger equation with the inclusion of expression (7) results in the radial equation as follows:

$$-\frac{\hbar^2}{2m}\left(\frac{d^2}{dr^2}+\frac{2}{r}\frac{d}{dr}\right)R_l(r)+\frac{l(l+1)\hbar^2}{2mr^2}R_l(r)=ER_l(r). \quad (8)$$

The solutions for the radial equation without potential are found to be any linear combination of spherical Bessel functions of the first and second kind $j_l(kr)$ and $n_l(kr)$. Given the boundary condition that $R_l(r)$ must be finite at the origin, $n_l(kr)$ terms are discarded since they diverge at the origin. Thus the general solution without potential is in the form:

$$\psi(r,\theta)=\sum_{l=0}^{+\infty}c_l j_l(kr)P_l(\cos\theta) \quad (9)$$

Given the limiting behavior $$j_l(kr)\xrightarrow{r\to+\infty}\frac{1}{kr}\sin\left(kr-\frac{1}{2}l\pi\right), \quad (9)$$

it is seen that each term in the summation of Expression (9), each term herein called a "partial wave," would indeed approach a spherical wave with angle-dependent amplitude at infinity.

Now consider a scattering potential imposed in a solid state material, e.g., a semiconducting material by, e.g., a dopant center in the semiconducting material, and assume that the scattering potential is a finite-range potential, which means that for the electrostatic potential in radial coordinates, $V(r)=0$ beyond certain cut-off radius $r_{cut}$. Then outside of the cut-off radius, the radial Schrödinger equation takes exactly the same form as that in vacuum, with again the solutions being linear combinations of spherical Bessel functions. This time, however, the $n_l(kr)$ terms remain because now the origin is excluded from the solution domain. Therefore the general solution outside of the cut-off radius takes the form:

$$\psi_{out}(r,\theta)=\sum_{l=0}^{+\infty}(a_l j_l(kr)+b_l n_l(kr))P_l(\cos\theta), \quad (10)$$

where $a_l$ and $b_l$ are constants that can be found by enforcing the proper boundary conditions at $r=r_{cut}$. The limit behavior now becomes:

$$a_l j_l(kr)+b_l n_l(kr)\xrightarrow{r\to+\infty}\frac{1}{kr}\left[a_l\sin\left(kr-\frac{1}{2}l\pi\right)-b_l\cos\left(kr-\frac{1}{2}l\pi\right)\right], \quad (11)$$

$$=\frac{c_l}{kr}\sin\left(kr-\frac{1}{2}l\pi+\delta_l\right)$$

where $c_l=\sqrt{a_l^2+b_l^2}$ and $$\delta_l=\arctan\left(-\frac{b_l}{a_l}\right)$$

is called the phase shift for the $l^{th}$ partial wave. Expression (11) indicates that the only effect of a finite-range electrostatic scattering potential on the limit behavior of the electron wave function is to "shift" each partial wave of the electron wave function with certain amount of phase, $\delta_l$.

It is herein understood that based on this partial wave phase shift, the scattering amplitude, $f(\theta)$, uniquely depends on the phase shifts, and this can be confirmed by matching Expression (11) with the scattering boundary condition of Expression (1). Given the expansion of a plane wave into spherical waves:

$$e^{ikz}=e^{ikr\cos\theta}=\sum_{l=0}^{+\infty}(2l+1)i^l j_l(kr)P_l(\cos\theta)\xrightarrow{r\to+\infty} \quad (12)$$

$$\sum_{l=0}^{+\infty}(2l+1)i^l\frac{1}{kr}\sin\left(kr-\frac{1}{2}l\pi\right)P_l(\cos\theta),$$

then the boundary-matching gives the expression as:

$$\sum_{l=0}^{+\infty}(2l+1)i^l\frac{1}{kr}\sin\left(kr-\frac{1}{2}l\pi\right)P_l(\cos\theta)+\frac{f(\theta)}{r}e^{ikr}= \quad (13)$$

$$\sum_{l=0}^{+\infty}(2l+1)i^l c_l'\frac{1}{kr}\sin\left(kr-\frac{1}{2}l\pi+\delta_l\right)P_l(\cos\theta)$$

where $$c_l'=\frac{1}{(2l+1)i^l}c_l$$

for convenience.

By writing sine functions as combined exponentials (incoming wave $e^{-ikr}$ and outgoing wave $e^{ikr}$) and matching the coefficients of both incoming and outgoing waves, the following relations can be obtained:

$$c_l'=e^{i\delta_l}, \quad (14)$$

$$f(\theta)=\frac{1}{2ik}\sum_{l=0}^{+\infty}(2l+1)(e^{i2\delta_l}-1)P_l(\cos\theta), \quad (15)$$

based on which the total scattering cross section, $\sigma_{tot}$, can be found as:

$$\sigma_{tot}=2\pi\int_0^\pi|f(\theta)|^2\sin\theta\,d\theta \quad (16)$$

$$=\frac{2\pi}{k^2}\int_0^\pi\left|\sum_{l=0}^{+\infty}(2l+1)e^{i\delta_l}\sin\delta_l P_l(\cos\theta)\right|^2\sin\theta\,d\theta.$$

Given the orthogonality relation for associated Legendre polynomials:

$$\int_{-1}^{1} P_m(x) P_n(x)\, dx = \frac{2}{2n+1}\delta_{mn}, \tag{17}$$

Then Expression (16) can be simplified to:

$$\sigma_{tot} = \frac{4\pi}{k^2} \sum_{l=0}^{+\infty} (2l+1)\sin^2\delta_l. \tag{18}$$

Expression (18) demonstrates that the phase shifts of partial waves of the matter wave of an electron that is conducting through a solid state material add together to contribute to the total scattering cross section. The total scattering cross section is a sum over the partial waves with values of angular momentum, l, ranging from zero to infinity. This result can be understood in an intuitive way: the scattering potential of a scattering center, such as a dopant center, "pulls in" or "pushes out" each partial wave by a different amount, and thus the interference pattern from the superposition of all the partial waves is varied from the unperturbed plane wave, so that each partial wave is phase-shifted relative to the incoming wave.

Note that the partial waves outside the scattering potential region are periodic functions, here given as a sine function. Thus, if the phase of a partial wave of the electron matter wave is changed by a multiple of π, the partial wave outside the scattering potential region looks exactly the same as the unperturbed one, and does not contribute to the scattering cross section at all. Therefore, for the scattering cross section of a certain partial wave to be zero, the phase shift of the partial wave must be a multiple of π. It is prescribed therefore, to minimize the scattering of an electron, or hole, during transport in a solid state material, that the partial wave phase shifts of the electron or hole matter wave be manipulated in a manner that sets the partial wave phase shifts to a multiple of π, or to zero. This minimizes the impact of the scattering potential on the transporting electrical charge carrier. Such a scattering potential effectively cloaks a scattering center from charge carriers that are conducting in the vicinity of the scattering center. In other words, the electrostatic potential of the scattering center is screened from the charge carriers, and there is no observable difference between the incoming and the outgoing wave of the charge carriers, which is as if there is no scattering center present.

To determine the requisite cloaking phase shifts, the radial Schrödinger equation with the scattering potential is solved within the cut-off radius first either by analytic methods for simple cases or by numerical methods for more general cases. Then the continuity of both wave functions and the probability flux at the cut-off radius is enforced. Denoting the logarithmic derivative of the lth partial wave right outside of the cut-off radius as $$\gamma_l = \frac{R_l'}{R_l}\bigg|_{r=r_{cut}},$$

then given Expression (11), the phase shifts can be solved as:

$$\delta_l = \arctan\left(\frac{k j_l'(k r_{cut}) - \gamma_l j_l(k r_{cut})}{k n_l'(k r_{cut}) - \gamma_l n_l(k r_{cut})}\right). \tag{19}$$

For any given finite-range electrostatic scattering potential in a solid state material that is produced by a scattering center, Expressions (18) and (19) can be used to predict the total elastic scattering cross section of electrons with a specific energy in the solid state material, e.g., the Fermi level energy of the material, after the radial Schrödinger equation has been solved within the potential range. In principle, all the partial waves of the electron matter wave contribute to the total scattering cross section. In practice, however, the phase shifts of higher order partial waves are negligibly small, and the summation in Expression (18) converges fast. A general rule of thumb is that the summation converges for angular momentum l>ka, where k is the wave number of the electrons and a is the radius of the scattering center, e.g., a dopant nanoparticle, herein termed the cut-off radius, indicating that only the lowest few partial waves need to be taken into account when ka is small.

In a three-dimensional solid state semiconducting material, the electrical charge carriers, e.g., electrons, which contribute most significantly to electrical transport generally reside slightly above the bottom of the conduction band, or in the case of holes, slightly below the top of the valence band. Considering an example with a combination of typical values of material parameters, e.g., Fermi level energy, $E_F=10$ meV, effective mass, $m_0$, of dopant center, $m_0=1$, and radius, a, of dopant center, $a=2$ nm, the term ka≈1. Thus for practical purposes, the scattering potential can be substantially entirely eliminated, to thereby effectively cloak scattering centers, by adjusting the parameters of the scattering centers, relative to the electron matter wave, to cause the cross sections of only the $0^{th}$ order and the $1^{st}$ order partial waves of the electron matter wave to vanish at the same time.

Figure 1B:
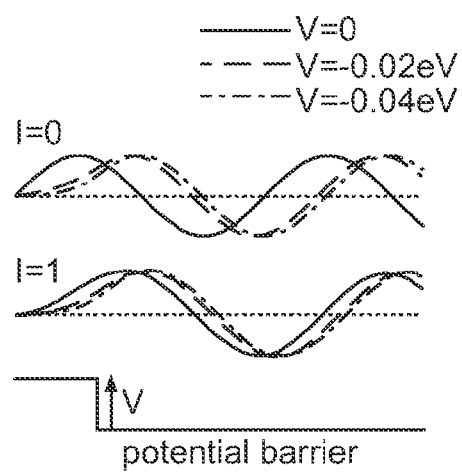

In the design of scattering centers, such as dopant centers, to minimize the resulting scattering cross section, it can be preferred, for simplicity and practicality, to consider only those material parameters that produce uniform potential wells and uniform potential barriers so that the radial Schrödinger equation can be solved analytically. Referring to FIGS. 1A-1B, in considering the design of scattering centers that produce such potential wells and barriers, it is noted that uniform potential wells and barriers play opposite roles in shifting the phase of the partial waves of a conducting electrical charge carrier. FIG. 1A illustrates the impact of a potential well on the 0 order and $1^{st}$ order partial waves, and FIG. 1B illustrates the impact of a potential barrier on the 0 order and $1^{st}$ order partial waves, for three energies. A potential well tends to "pull in" a partial wave, or give a negative phase shift, while a barrier does the opposite, and both have a stronger effect on lower order partial waves than on higher order ones.

It is seen that there can be achieved zero scattering cross section for one partial wave even with a single potential well, but it is nontrivial to achieve a few partial waves with zero scattering at the same energy. With a single potential well (barrier), the $0^{th}$ order partial wave tends to pick up a more negative (positive) phase shift than the $1^{st}$ order partial wave, and the depth (height) required to give rise to a phase difference of π between the two is so large that it can be required to include higher order contributions. While this can be achieved for certain conditions and applications, it is recognized that it can be difficult to design a scattering center, e.g., a dopant center, that can be cloaked from electrical charge transport with only a single uniform potential well or barrier.

It can therefore be preferred for many applications to provide design a scattering center, such as a dopant center, as a plurality of material regions that together form a scattering center and that together produce a corresponding scattering potential. For the intentional inclusion of dopant centers in a semiconducting material, it can be preferred to design a plurality of dopant center material regions to achieve both a desired doping concentration and a desired scattering potential that minimizes scattering of electronic charge in the vicinity of the dopant center. One or more of the material regions can be ionized, thereby donating free charge carriers to the host material in which the dopant center is introduced.

Figure 2A:
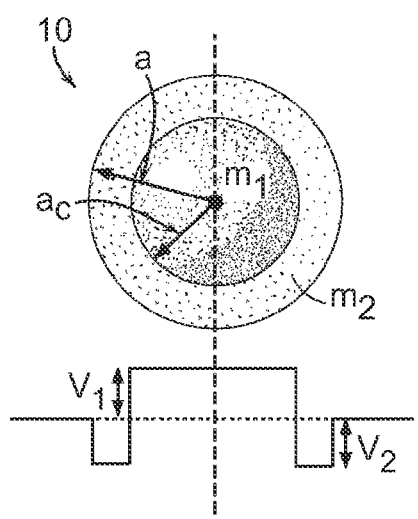
FIG. 2A is a schematic cross-sectional view of a scattering center particle having a core material region that produces a potential barrier, and a shell material region that produces a potential well, in a host material in which the particle is disposed and an electron wave is traveling.

In one example of such, consider a core-shell structured particle 10 like that shown in FIG. 2A. The core-shell particle includes a core region 12 that is spherically nested in an outer shell 14. While one outer shell 14 is shown here for clarity, any number of nested shells can be included. The core region 12 has a corresponding effective mass, $m_1$, and each shell region 14 has a corresponding effective mass, $m_2$; each in a plurality of shell regions can have distinct effective masses. The particle has a total radius, a, and the core has a core radius, $a_c$. Based on the materials selected for the core and shell regions, each region has a band offset from that of the host solid state material. The scattering potential that results from selection of these six parameters for this core-shell particle can be tailored such that the core and shell produce differing potentials, e.g., with one of the core and shell producing a potential barrier, one of the core and shell producing a potential well, or both core and shell producing a potential barrier or potential well, each of differing height or depth. The core region and/or the shell region can be ionized to provide free charge carriers to a host material into which the particles are introduced.

As shown in FIG. 2A, in one example, the core region 12 is designed to produce an electrostatic potential that is a potential barrier, with height $V_1$ positive band offset relative to the host material matrix, and the shell region 14 is designed to produce an electrostatic potential that is a potential well, i.e., a negative band offset relative to the host material, with depth $|V_2|$. First there is solved the radial Schrödinger equation inside the core-shell structure. Because the potential profile is piecewise constant, the solutions are linear combinations of spherical Bessel functions of the first and second kind with different wave vectors characterized by the potential and effective mass of each of the structure's regions.

Inside the core, the solution is chosen as $\Psi_{l1}(r)=j_l(\alpha r)$, for $r \leq a_c$, where $$\alpha = \frac{\sqrt{2m_1(E-V_1)}}{\hbar^2}$$

is the wave vector with $m_1$ being the effective mass of the core and $V_1$ the electrostatic scattering potential of the core, $a_c$ is the radius of the core, and the spherical Bessel function of the second kind $n_l(kr)$ is dropped here to guarantee that the wave function is finite at the origin. The solution in the shell region can be written as $\Psi_{l2}(r)=Aj_l(\beta r)+Bn_l(\beta r)$ for $a_c \leq r \leq a$, where A and B are coefficients to be determined and $$\beta = \frac{\sqrt{2m_2(E-V_2)}}{\hbar^2}$$

with similar notions of effective mass and potential in the shell. If the wave vectors become pure imaginary, as is the case when E is smaller than the potential barrier, the solutions are modified spherical Bessel functions, or spherical Bessel functions with imaginary arguments. The subsequent expressions are still valid with imaginary wave vectors. Considering the discontinuity of effective mass at a radius $r=a_c$, the usual boundary conditions are modified to maintain the continuity of both the wave function and the probability flux, as:

$$\Psi_{l1}(a_c) = \Psi_{l2}(a_c), \tag{20}$$
and $$\left.\frac{\Psi'_{l1}}{m_1}\right|_{r=a_c} = \left.\frac{\Psi'_{l2}}{m_2}\right|_{r=a_c} \tag{21}$$

Thus the following equations can be derived for the coefficients A and B:

$$\begin{bmatrix} j_l(\beta a_c) & n_l(\beta a_c) \\ \beta j'_l(\beta a_c) & \beta n'_l(\beta a_c) \end{bmatrix} \begin{pmatrix} A \\ B \end{pmatrix} = \begin{pmatrix} j_l(\alpha a_c) \\ \frac{m_2}{m_1}\alpha j'_l(\alpha a_c) \end{pmatrix} \tag{22}$$

Similar boundary conditions apply at the radius r=a, where the logarithmic derivative is evaluated as:

$$\gamma_l = \frac{m_0}{m_2} \frac{A\beta j'_l(\beta a) + B\beta n'_l(\beta a)}{A j_l(\beta a) + B n_l(\beta a)} \tag{23}$$

Combining Expressions (22) and (23) gives the expression for the logarithmic derivative $\gamma_l$ as:

$$\gamma_l = \frac{m_0}{m_2} \frac{\beta^2 j_l(\alpha a_c)n'_l(\beta a_c)j'_l(\beta a) - \frac{m_2}{m_1}\alpha\beta j'_l(\beta a)j'_l(\alpha a_c)n_l(\beta a_c) + \frac{m_2}{m_1}\alpha\beta j_l(\beta a_c)j'_l(\alpha a_c)n'_l(\beta a) - \beta^2 j_l(\alpha a_c)j'_l(\beta a_c)n'_l(\beta a)}{\beta j_l(\alpha a_c)n'_l(\beta a_c)j_l(\beta a) - \frac{m_2}{m_1}\alpha j_l(\beta a)j'_l(\alpha a_c)n_l(\beta a_c) + \frac{m_2}{m_1}\alpha j_l(\beta a_c)j'_l(\alpha a_c)n_l(\beta a) - \beta j_l(\alpha a_c)j'_l(\beta a_c)n_l(\beta a)} \tag{24}$$

Based on Expression (24), then the scattering cross sections can be calculated using Expressions (18) and (19). To simplify the design process, it can be preferred to not solve for solutions of a set of multi-variable nonlinear equations. Instead, it can be preferred to impose a condition in which the phase shift of each of the first two partial waves is set to be either 0 or $\pi$, and to impose this condition by only modifying the potential barrier height and/or potential well depth of the material regions of a particle, while fixing other parameters. This enables a direct design methodology.

Figure 2B:
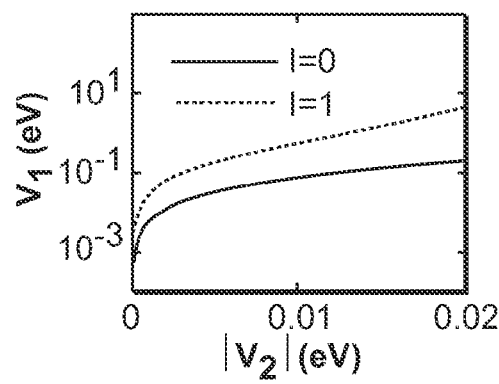
FIGS. 2B-2C are plots of combinations of potential barrier heights and potential well depths, produced by the core and shell of the particle of FIG. 2A, that produce a phase shift of zero and π respectively, for the $0^{th}$ and $1^{st}$ order electron partial waves, for an electron wave traveling in a host material in which the particle is disposed.
Figure 2C:
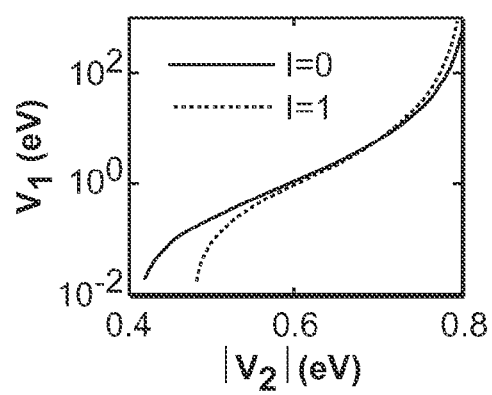

Referring to the plots of FIGS. 2B and 2C, an example of this design methodology is shown. Several combinations of the core and shell potential barrier height and potential barrier depth, $V_1$ and $V_2$, for the core-shell particle of FIG. 2A that produce partial wave phase shifts of 0 or $\pi$ are given. The effective mass of each of the regions are set as $m_1=m_2=m_0=1$, and the radius of the core, $a_c$ is set as $a_c=0.5a$. In the plot of FIG. 2B, there are shown combinations of values for the electrostatic scattering potentials, $V_1$ and $V_2$, that produce a phase shift of the $0^{th}$ and $1^{st}$ partial waves equal to zero. In the plot of FIG. 2B, the curves do not intersect because in this regime, $|V_2|$ is small and $V_1$ dominates. Given $V_2$, a larger $V_1$ is required for the $1^{st}$ order partial wave to maintain zero phase shift than is required for the $0^{th}$ order partial wave, because both potential barriers and potential wells have a stronger effect on lower order partial wave; i.e., the solution curve for the $1^{st}$ partial wave always shows a larger slope than that for the $0^{th}$ partial wave.

In FIG. 2C, there are plotted combinations of values for $V_1$ and $V_2$ that make the phase shift of the $0^{th}$ and $1^{st}$ partial wave equal to $\pi$. In this case, the two curves for the electrostatic potentials do intersect. For this condition, $V_1=3.589$ eV and $V_2=-0.671$ eV. In this case, based on the expressions above, the effective masses of the particle are then given as $m_1=m_2=m_0=1$, and $a=2$ nm, $a_c=0.5a=1$ nm.

The existence of this solution, i.e., the intersection of the two solutions for the two partial waves, can be explained by intuitive argument in terms of the phase shifts. Consider the condition in which $V_1=0$; here a deeper well (a larger $|V_2|$) is required for the $1^{st}$ partial wave to gain a phase shift of $\pi$ than the $0^{th}$ partial wave for the reasons given above. It is recognized that this may not always be true, as it is possible that certain choices of effective mass can give a larger initial phase shift to the Pt partial wave than the $0^{th}$ one. In this case, the solution that makes both phase shifts equal to $\pi$ does not exist, but the one that makes both phase shifts larger multiples of $\pi$ can be obtained by similar means. Beyond this point, an increase of the well depth, $|V_2|$, demands a larger increase of $V_1$ for the $1^{st}$ order partial wave than the $0^{th}$ order partial wave to keep the phase shift $\pi$, again resulting in a larger slope of the solution curve. A deeper (larger) 'starting point' and a greater slope of the solution curve for the $1^{st}$ partial wave guarantee that the two solution curves would cross each other, generating a combination of potentials, $V_1$ and $V_2$, that eliminates the cross sections of the first two partial waves at the same time.

This analysis technique can be employed for any suitable set of starting parameters to determine the requisite material conditions of a scattering center for achieving the desired phase shifts that cloak the scattering center. Referring to FIGS. 3A-3B, in one example of such, given starting conditions of $m_1=0.9$, $m_2=2.2$ and $a_c=0.75a=1.5$ nm for the coreshell structure of FIG. 2A, the corresponding solution of the potentials are $V_1=0.057$ eV and $V_2=-0.788$ eV to achieve the desired phase shifts. With these conditions, there can be plotted the resulting scattering cross section. FIG. 3A is a plot of the total scattering cross section as well as the contributions from the first three partial waves, as a function of energy. In the plot of FIG. 3A, there is clearly demonstrated a dramatic reduction in the scattering cross section at the energy $E=10$ meV. At this energy, the residue scattering cross section is smaller than 0.01% of the physical cross section, from the contribution of higher order partial waves. More remarkably, four orders of magnitude difference in the total scattering cross section is achieved within an energy range of only 40 meV.

FIG. 3B is a plot of the radial distribution functions of the $0^{th}$ order and $1^{st}$ order partial waves with and without the presence of the core-shell scattering center. A phase shift of $\pi$ is demonstrated for locations outside of the scattering center, resulting in a condition in which the wave functions outside the scattering center are substantially indistinguishable from each other, resulting in an effective cloaking of the scattering center from charge carriers transporting in the vicinity of the scattering center.

To provide a sense of how the matter wave of a conducting charge carrier, such as an electron matter wave, actually "gets through" a scattering center as a result of the cloaking design above, there can be visualized the scattered wave function, which can be calculated analytically by adding up the contributions from each partial wave. The result is shown in the plot of FIG. 4. Here partial waves with angular momentum up to $l=4$ are shown in the vicinity of a scattering center. The probability flux "stream lines" depict intuitively how the electron waves "go through" the cloaked scattering center, instead of "going around" the scattering center. The background shading in the figure depicts the phase distribution of the wave function. This depiction demonstrates that the effect of the scattering center potential can be considered to cause a diffraction of charge carriers around the center, with the wave function inside the scattering center being distorted in such a way that it fits smoothly to an undistorted wave function outside of the scattering center. For the design depicted here, the scattering center was set as a core-shell particle with outer radius $a=2$ nm, core radius $a_c=1.5$ nm, $m_1=0.9$, and $m_2=2.2$. With this scattering center design, the scattering potentials of the core and shell material regions are $V_1=0.057$ eV and $V_2=-0.788$ eV to achieve cloaking of the scattering center.

The methodology above can be followed to fully implement a prespecified scattering center that is to be intentionally introduced into a three-dimensional solid state material, e.g., as a dopant center in a semiconducting material. For a selected solid state material, there is first prespecified the Fermi level energy of the material at which the mobility of the free charge carriers is to be maximized by the cloaking technique. This depends on the particular application that one intends for the material as well as the properties of the material, such as the requisite doping concentration, the band structure of the material, and the free charge carrier concentration. Given the Fermi level energy of the solid state material at which a charge carrier mobility peak is desired, then the corresponding electron wave number, k, can be calculated for the selected material, as $$k = \frac{\sqrt{2mE}}{\hbar},$$

where k is the electron wave number, m is the effective mass of free charge carriers in the selected solid state material, E is the prespecified Fermi level energy, and $\hbar$ is Planck's constant. The electron wave number for the prespecified Fermi level energy then is employed to determine the corresponding wavelength of electrons for the material. The wave number is related to the de Broglie wavelength of the electrons as $$k = \frac{2\pi}{\lambda},$$

where $\lambda$ is the electronic wavelength.

Now knowing the prespecified Fermi level energy at which a mobility peak is desired and the corresponding electron wave number, the size of the dopant scattering center is designed such that the condition $ka \leq 1$ is satisfied, where a is the radius of the entire scattering center, e.g., outer radius of a core-shell particle, as in the core-shell particle design of FIG. 2A. For example, if the prespecified material is SiGe, and the prespecified Fermi level is 10 meV, then given the effective mass of the free charge carriers in SiGe, the corresponding maximum radius of the dopant scattering center to be produced is calculated as ~2 nm. This radius is preferably selected with constraints of operation of the material in mind.

For example, the mean free paths of the charge carriers in the solid state material due to other scattering mechanisms should be greater than the size of the scattering center, so that the charge carriers transport coherently inside the scattering center.

With the scattering center total radius selected, then the design of the dopant scattering particle continues, e.g., with the selection of a core-shell particle design. Other designs can alternatively be employed; the core-shell design is one example of a scattering center particle design. Given the core-shell design, at least one particle property can be a priori selected, e.g., the radius of the core region of the particle, e.g., according to any limitations of the fabrication process for the particles, to reduce the complexity of the analysis. The electrostatic scattering potentials of the core and the shell regions are then found by numerical analysis to sweep the two resulting electrostatic potentials for selected conditions, e.g., in opposite directions, with one producing a potential well and one producing a potential barrier, using the expressions above, to locate the intersection of the two potentials that makes both phase shifts of the two lowest-order partial waves equal to $\pi$, or a multiple of $\pi$, or zero.

As explained above, it is not required that one core-shell region produce a potential barrier while the other produce a potential well; either region or both regions can be designed to produce a potential well or barrier. A plurality of shell regions can further be included to produce additional shell potentials. Whatever arrangement of potentials is produced, given the specified electrostatic potentials of the core and shell regions, the corresponding materials for the core and the shell regions can then be chosen, specifically so that their band edge mismatches with respect to the host material lead to the desired values of the electrostatic scattering potentials in the material.

Figure 5A:
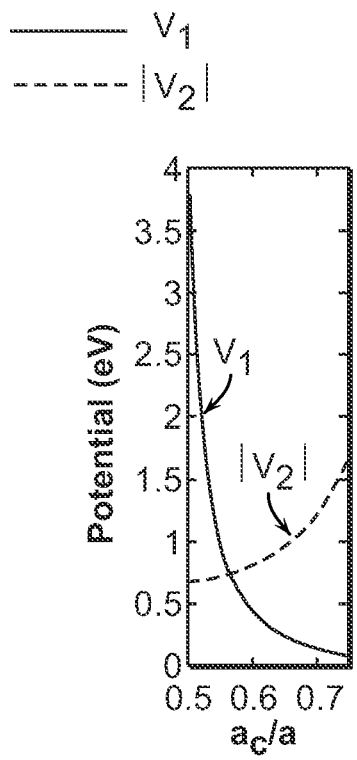
FIG. 5A is a plot of prespecified scattering potential produced by the core and scattering potential produced by the shell of the scattering center particle of FIG. 2A, corresponding to choices for a range of core and shell radii.

A particular advantage of this cloaking design methodology is the flexibility provided by the design parameters. By adjusting other parameters, a wide range of potential barrier heights and potential well depths can be specified to achieve a selected scattering center electron cloak. For example, given a core-shell particle as an intended scattering center, the ratio between the radii of the core and shell can be varied, providing great flexibility in the practical design. FIG. 5A is an example of such. Here are plotted the scattering potentials that are produced by the core, $V_1$, and the shell, $V_2$, of a core-shell particle, for a range of core and shell radii. In this example, the particle is designed with effective masses, $m_1=m_2=1$, and total particle radius, a=2 nm. A wide range of potentials can be achieved by varying the radii, as demonstrated in the plot.

Figure 5B:
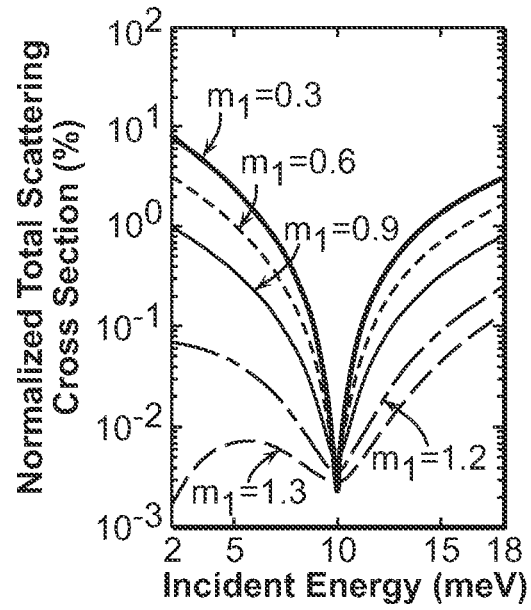
FIG. 5B is a plot of scattering center cross sections as a function of electron energy for the core-shell scattering center particle of FIG. 2A for each in a range of core effective masses.

Further, the Fermi level energy or range of energies of the material at which a minimum in scattering, corresponding to a maximum in scattering center cloaking and corresponding maximum charge mobility, can be prespecified for a selected application. This is achieved by prespecifying the effective mass of the scattering center, e.g., the effective mass of the core and shell materials in a core-shell particle. Referring to the plot of FIG. 5B, there are shown the energy-dependent scattering cross-sections for core-shell particles having various core effective masses as indicated in the plot. As shown in FIG. 5B, different scattering-energy dependences can be obtained by changing the effective mass of the core in a reasonable range. In the example for which data is plotted here, $m_2=2.2$, $m_0=1$ and $a_c=0.75a=1.5$ nm. A sharply varying energy dependence for scattering can be desired for particular applications, such as thermoelectrics, electronic switching, and electronic sensing. Conversely, a relatively flat energy dependence for scattering can be desired for applications in which it is desired to cloak charge carriers over a wide range of incident energies.

To measure the cloaking condition of a material, the Fermi level energy of a material in which the designed scattering centers are have been introduced can be changed by doping various samples of the material with differing dopant concentrations, or the Fermi level energy can be shifted by applying a voltage to the material. In practice, with the designed scattering centers in place in a material, the electrical charge carrier mobility and the Seebeck coefficient of the material are measured while sweeping the Fermi level in this manner. The charge carrier mobility can be measured using, for example, the Hall effect, in the conventional manner. A peak in the charge carrier mobility centered around the prespecified Fermi energy level at which the free charge carriers possess the peak mobility should be observed. At the same time, the Seebeck coefficient value should increase at the same energy range.

Figure 6:
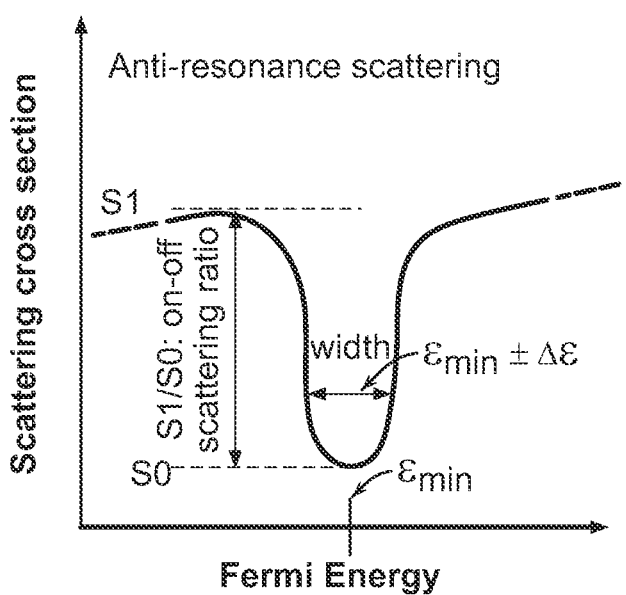
FIG. 6 is a plot of scattering cross section as a function of Fermi energy, which is the incident energy of electrons traveling in a host material, defining a prespecified Fermi level energy at which the scattering cross section is minimized, and defining a range of Fermi level energies at which the scattering cross section is minimized.

This condition is further specified by considering the plot of FIG. 6. In FIG. 6 there is plotted the cross section for scattering of a scattering center in a three-dimensional semiconducting material. The dopant scattering centers that are provided in the semiconducting material are designed based on the methodology above such that at a prespecified Fermi level, $\in_{min}$, scattering is minimized and electrical charge mobility is maximized. This minimization of scattering occurs for a prespecified energy width, or energy range, $\in_{min}\pm\Delta\in$, that is centered at a selected, prespecified Fermi energy. The dopant scattering centers are cloaked, and invisible to the electrical charge carriers, for material Fermi level energies that are within the prespecified energy range, $\in_{min}\pm\Delta\in$. The prespecified Fermi energy range can be specified as a selected range of energies that reflect operating conditions, e.g., $\in_{min}\pm5$ kT, thereby setting a range of energy in which enhanced charge carrier mobility, and corresponding enhanced conduction, occurs.

With this characteristic, the prespecified Fermi energy and the width of the energy window, or the range of prespecified energies, around the Fermi energy at which scattering is minimized can be designed to achieve particular functions for a wide range of applications. In one example, the scattering ratio, $S_1/S_0$, between a maximum scattering condition, $S_1$, and a minimum scattering condition, $S_0$, that occurs at the prespecified Fermi energy, as shown in the plot of FIG. 6, can be specified. By tuning $\in_{min}$, $\Delta\in$ and the on-off scattering ratio, there is allowed only electrical charge carriers of energy $\in_{min}\pm\Delta\in$ to conduct, with electrical charge carriers of other energies being effectively blocked from conduction. As a result, only carriers with energies within the prespecified range $\in_{min}\pm\Delta\in$ contribute dominantly to electrical current conduction. By cloaking the dopant scattering centers in this prespecified Fermi level energy range, the negative impact of these centers on the carrier mobility is removed and carrier mobility is enhanced significantly. Accordingly, in materials in which the main limiting factor of carrier mobility is dopant impurity centers, e.g., in single crystals at low temperatures, this design of the dopant particles can enable almost perfect transmission of the electrical charge carriers through the materials.

For a wide range of applications, this energy dependence of carrier mobility can be exploited to implement a switching function in electrical current through a material. For example, there can be applied to a three-dimensional semiconducting material a controllable voltage, to enable control of the potential within the material and effectively shift the Fermi level of the material and correspondingly, the energy of charge carriers in the material. Referring to the plot of FIG. 6, as an applied voltage to a semiconducting material is changed, e.g., from a low voltage to a high voltage, then as the applied voltage causes the Fermi level of the material to reach the left edge of the window, or range, of minimum scattering, the electrical current through the material switches from a relatively low value of electrical current to a relatively high value of electrical current. Then as the applied voltage is adjusted to cause the Fermi level to reach the right edge of the window, or range, of minimum scattering, the electrical current through the material switches from a relatively high value of electrical current to a relatively low value of electrical current. By controlling the scattering ratio, there can be controlled the on-off current ratio as the voltage is changed between those voltage values that set the Fermi level within the high-mobility window and those voltage values that set the Fermi level outside of the high-mobility window. Thus, the application of a controllable voltage to a material, such as a semiconducting material, that includes dopant scattering centers having the design above, can be employed as an electrical current switch.

In a further application, the design of scattering centers that are intentionally introduced into a three-dimensional material can be employed for thermoelectric applications. A thermoelectric material converts heat directly into electricity. Thermoelectrics are important in the fields of, e.g., waste heat harvesting, power generation, and electronic cooling. In addition to their practical significance, thermoelectric phenomena involve intricately coupled transport of both heat and electrical charge carriers.

High thermoelectric performance requires the optimization of the material figure of merit, ZT, given as:

$$ZT = \frac{S^2 \sigma T}{\kappa_e + \kappa_p}, \quad (25)$$

where S is the Seebeck coefficient, $\sigma$ is the electrical conductivity of the thermoelectric material, $\kappa_e$ is the electronic thermal conductivity of the thermoelectric material, and $\kappa_p$ is the lattice thermal conductivity of the thermoelectric material. The most commonly used material at room temperature in commercial thermoelectric modules is $Bi_2Te_3$, with a figure of merit of about unity.

The Seebeck coefficient is a measure of the electrical voltage that is induced in a thermoelectric material by a given amount of temperature difference across the material, and manifests itself as a consequence of the asymmetry of the transport properties, including the density of states (DOS) as well as the scattering properties of the electrical charge carriers with energies around the Fermi level of the thermoelectric material. The Mott expression for the Seebeck coefficient, S, which is valid for metals at zero temperature, is given as:

$$S = \frac{\pi^2}{3}\frac{k_B}{q}k_B T \frac{\sigma'(E)}{\sigma(E)}\bigg|_{E=E_F} = \frac{\pi^2}{3}\frac{k_B}{q}k_B T \left\{\frac{1}{D}\frac{dD(E)}{dE} + \frac{1}{\mu}\frac{d\mu(E)}{dE}\right\}\bigg|_{E=E_F}, \quad (26)$$

where $\sigma(E)$ is the differential conductivity, D(E) is the density of states and $\mu(E)$ the carrier mobility, as a function of material energy, and $k_B$ is the Boltzmann constant. To enhance the Seebeck coefficient, sharp features of either the density of states or the carrier mobility near the Fermi level is required. It is, however, not sufficient to enhance Seebeck coefficient alone to achieve high performance in thermoelectrics. Good thermoelectrics also require a high electrical conductivity, which in turn relies on high carrier concentration and high carrier mobility. Metals have high carrier concentration, but a free-electron-like DOS structure is generally too symmetric to produce a reasonable Seebeck coefficient, a fact that excludes metals as candidates for good thermoelectrics. For semiconductors, heavy doping is needed for high carrier concentration, and the optimal Fermi level usually resides in the conduction or valence band. Thus sharp features of the DOS deep into the bands may also result in a sufficient Seebeck coefficient, suggesting the use of thermoelectric materials like PbTe and SnTe, due to their sharp upturn in the DOS in their valence bands at the emergence of the second valence band.

The heavy doping that is required to achieve this condition conventionally results in significantly reduced carrier mobility due to increased dopant impurity scattering. This condition can be eliminated by designing the dopant impurity with the scattering center methodology given above, to cloak the dopant impurities from electron transport. Cloaking of the dopant impurity provides the ability to maintain or even enhance the Seebeck coefficient at the same time that charge carrier mobility is enhanced. Furthermore, the acoustic mismatch that is to be expected between the dopant impurity scattering centers and the host material results in an increase in phonon scattering, with a corresponding decrease in thermal conductivity of the material lattice. Thus, with the design of the dopant impurities as scattering centers that are cloaked from electrical charge transport, there can be simultaneously achieved improvement in all three parameters, the Seebeck coefficient, the electrical conductivity of the thermoelectric material, and the thermal conductivity of the thermoelectric material, all of which are important for achieving a superior thermoelectric figure of merit, ZT. With the dopant scattering centers designed to produce a radial electrostatic scattering potential profile that minimizes electron scattering within the prespecified window, or energy range, of enhanced mobility centered at the prespecified Fermi level, and if the scattering cross section, as in the plot of FIG. 6, has a large slope at the edges of the window, then the Seebeck coefficient will be enhanced. This scattering cross section profile is herein termed anti-resonance scattering.

A conceptual demonstration of this "anti-resonance effect" is shown in the plots of FIGS. 7A-7D. In FIG. 7A there are depicted two example scattering rates that could be employed to enhance thermoelectric performance. The first example demonstrates "resonance scattering," or a peak in the scattering rate. The second example shown is "anti-resonance scattering," or a dip in the scattering rate. A constant background scattering rate is added to each case. In FIGS. 7B-C, there are plotted the corresponding electrical conductivity and Seebeck coefficient versus the Fermi level energy for the "resonance" and "anti-resonance" conditions of FIG. 7A, as well as for a constant background scattering condition. As shown in the figures, the simultaneous enhancement of Seebeck coefficient and electrical conductivity is achievable in the case of the "anti-resonance" condition produced by corresponding dopant centers, while in the case of a "resonance" condition and corresponding dopant centers, the electrical conductivity drops, due to increased scattering, even though the Seebeck coefficient is improved. This demonstrates that a greater improvement of the power factor can be obtained with "anti-resonance" dopant centers than "resonance" dopant centers, as plotted in FIG. 7D.

In one example implementation of cloaked dopant centers in a thermoelectric material, consider the GaAs material system. GaAs properties are well known. The following GaAs properties can be considered in designing cloaked dopant centers to be introduced into GaAs: A single parabolic band structure; an effective mass, at the Γ valley, of $0.063m_0$; a static dielectric constant of 12.9; a high frequency dielectric constant of 10.89; a density of $5.317 \text{ g·cm}^{-3}$; a sound velocity of $5.22 \times 10^5$ cm/s; a polar optical phonon energy of 0.03536 eV; and an acoustic deformation potential of 7 eV.

In one example, with this GaAs system profile, there can be designed dopant center particles, such as the core-shell particle arrangement of FIG. 2A, for enhancing charge carrier mobility in the GaAs, as well as for enhancing other thermoelectric properties. In Table I below there is presented parameters of core-shell particles for an electrically neutral particle, Z=0, for a single-charge particle, with Z=1, and a double-charge particle, with Z=2, that are developed, based on the methodology given above.

TABLE I

| Z | Parameters | Core | Shell |
|---|---|---|---|
| Z = 0 | Effective mass | 0.58 $m_0$ | 0.6 $m_0$ |
| | Band offset from GaAs | −30 meV | −285 meV |
| | Layer size | 3 nm radius | 1 nm-thick |
| Z = 1 | Band offset from GaAs | 11 meV | −285 meV |
| Z = 2 | Band offset from host | 33 meV | −285 meV |

FIG. 8A is a plot of scattering cross section as a function of electron energy for the Z=1 core-shell particle of Table I. The potential profile of the core-shell is plotted in FIG. 8B. For this system, the volume fraction of core-shell dopant centers is given as 1%, and the doping level is given as $5 \times 10^{16}$ cm$^{-3}$, which corresponds to about one electron per core-shell dopant center. As shown in the plot of FIG. 8A, for this set of variables, the roots of partial waves for angular momentum l=0 and l=1 scattering cross sections occur at very closely-spaced energies, resulting in a sharp dip in the total scattering cross section at those energies. For carriers of energies close to this minimum, which is about 27 meV, the core-shell dopant particles are fully cloaked, or screened, so that electrons pass through these particles without any scattering. The minimum of the $0^{th}$ and $1^{st}$ partial waves does not converge perfectly due to the band bending induced by the charge transfer and screening effect because the cloaked dopant centers are the donors of the charge carriers. This non-perfect convergence, does not, however, diminish the sharp minimum of the total scattering cross section This example demonstrates the great flexibility in dopant center design to achieve cloaking, as there are many adjustable parameters of the dopant, and anti-resonances can be easily identified by looking at the roots of different angular momentum partial wave components. For example, as the potential barrier height is increased, the position of the minimum in scattering cross section shifts to higher energies, and as the bending of the scattering potential is increased, by means of increasing the number of donated electrons per dopant center, or decreasing the screening length, the minimum in scattering cross section shifts to lower energies. All the three sets of material parameters reported in Table 1 result in a similar cross section as that reported in the plot of FIG. 8A. It is recognized, however, that to obtain a similar level of charge carrier density, a lower volume fraction of more charged scattering centers is required. Therefore, for the same Fermi level, the scattering rate of core-shell particles with Z=2 is lower than particles with Z=1. In addition, an arbitrary concentration of neutral scattering centers can be added to increase the scattering rate. Therefore, it is relatively easy to tune the scattering rate of the designed dopant scattering centers.

Considering this process in a manner like that described above, given a total radius, a, for each core-shell dopant particle, and an area, $b^2$, in the host material, in which only one core-shell particle on average exists, then there can be computed the parameters of the system such as that considered in FIGS. 8A-8B. The volume fraction of core-shell particles, $V_{fr}$, is given as:

$$V_{fr} = \frac{4\pi a^3}{3b^3}; \tag{27}$$

and the density of core-shell particles, $\rho_{np}$, and free carrier density, n, are given as:

$$\rho_{np} = \frac{3V_{fr}}{4\pi a^3}; \qquad n = z\rho_{np}. \tag{28}$$

The Fermi level, μ, of the system is determined from the solution of:

$$n = \int Dos(\in) f(\in -\mu) d\in, \tag{29}$$

and the Thomas-Fermi screening length, 1/λ, is calculated as:

$$\lambda^2 = \frac{q^2}{\varepsilon} \int Dos(\varepsilon) \frac{\partial f}{\partial \varepsilon} d\varepsilon; \tag{30}$$

where Dos(∈) is the density of states inside the host material and ƒ(∈−μ) is the Fermi-Dirac function. The electrostatic scattering potential of the dopant scattering center is calculated based on the Thomas-Fermi model of screening by solving the Poisson equation, assuming that the charge is uniformly distributed inside the nanoparticle. The ion charge density, $\rho_+(r)$, is given as:

$$\rho_+(r) = \begin{cases} \frac{z}{4/3\pi a^3} & 0 < r < a \\ 0 & a < r. \end{cases} \tag{31}$$

According to the Thomas-Fermi approximation, the potential and the carrier density in Fourier space are related through:

$$V(q) = \frac{4\pi}{q^2 + \lambda^2} \rho(q) \tag{32}$$

The electrostatic scattering potential of the core-shell particle is then calculated by adding the potential determined by Expressions (31) and (32) and the band offsets between dissimilar materials. Given the determined potential, the wave function for a given electrical charge carrier energy is then calculated by solving the Schrödinger equation inside the particles, in the manner given above. At the material boundaries, e.g., at the core-shell interface and the particle-host material interface, there is discontinuity of the band profile, i.e., the band offset, as well as the effective mass. To prevent numerical errors it can be preferred to smooth these junctions by a Fermi-type function with a width of about 100 mesh points, corresponding to about 1 A°. Then, the slope of the wave function can be determined over its absolute value at the edge of the nanoparticle, r=a, as:

$$\gamma_l = \frac{R'}{R}\bigg|_{r=a} \tag{33}$$

The partial-wave method given above, with Expressions (18) and (19), is then used to calculate the scattering cross-section from a spherically symmetric potential, for plotting the data in FIG. 8A.

Figure 9:
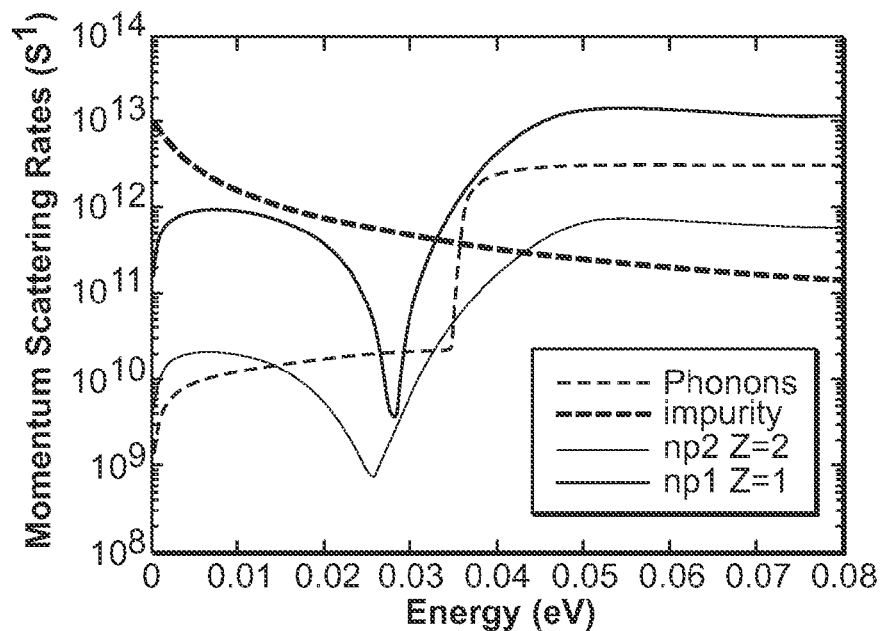
FIG. 9 is a plot of momentum scattering rates for phonon scattering and scattering due to the introduction of a conventional ionized dopant impurity at the optimum Fermi level of −5 meV in a host material, and plots for of scattering rate for a core-shell dopant particle that is combination of the Z=0 and Z=1 particles of Table I, resulting in average Z=0.1 charges per particle, and for a core-shell dopant particle that is the Z=2 particle of Table I.
Figure 10A:
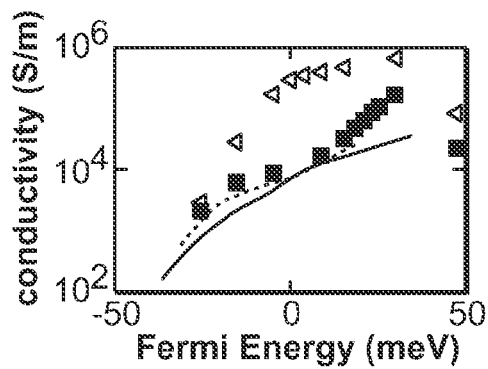
FIGS. 10A-10D are plots of the electrical conductivity, $\sigma$, the Seebeck coefficient, S, and the product of $\sigma S^2 T$ for a GaAs host material at 50 K, for a conventional ionized impurity atom, a Z=2, homogeneous nanoparticle of 3 nm radius; and the two core-shell dopant particles described above with reference to FIG. 9, with Z=0.1 and Z=2.
Figure 10B:
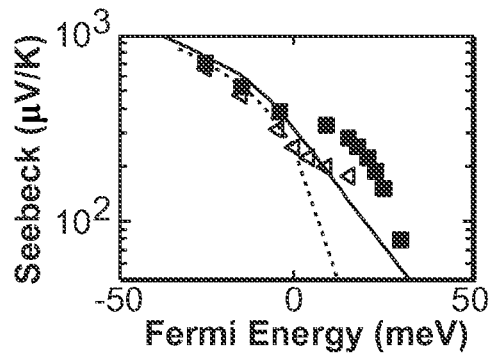
Figure 10C:
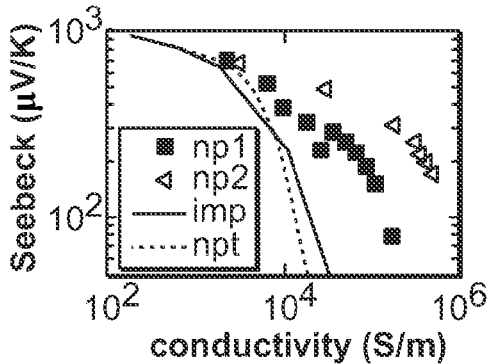
Figure 10D:
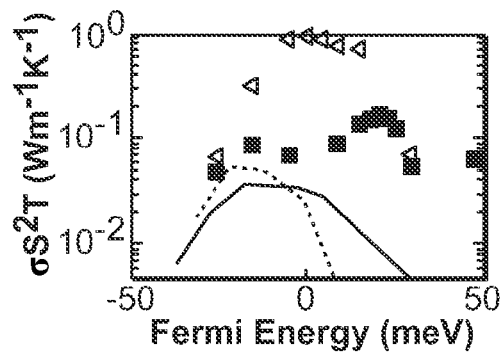
Figure 11A:
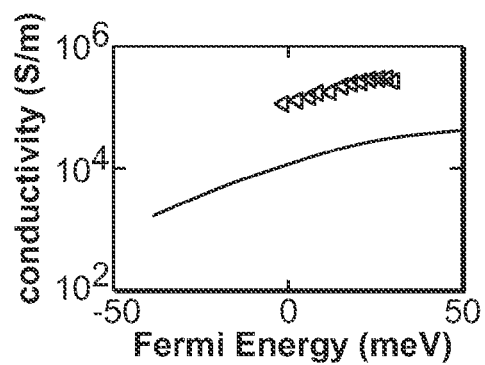
FIGS. 11A-11D are plots of the electrical conductivity, $\sigma$, the Seebeck coefficient, S, and the product of $\sigma S^2 T$ for a GaAs host material at 100 K, for a conventional ionized impurity atom, a Z=2, homogeneous nanoparticle of 3 nm radius; and the two core-shell dopant particles described above with reference to FIG. 9, with Z=0.1 and Z=2.
Figure 11B:
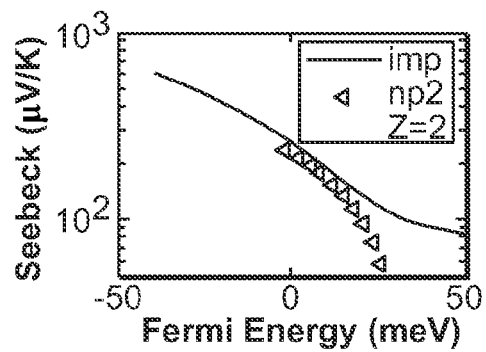
Figure 11C:
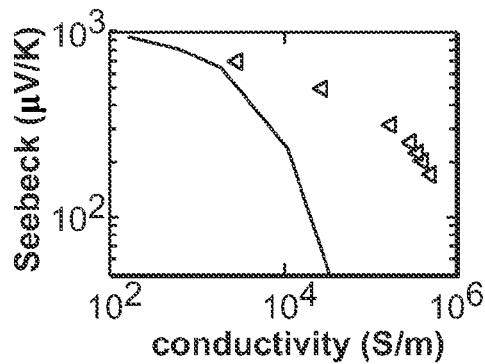
Figure 11D:
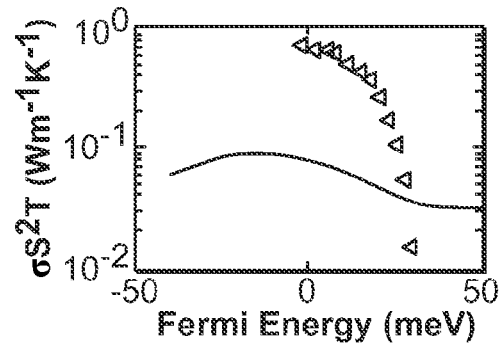

Considering the scattering rates in a host material in which scattering centers are intentionally introduced, consider again the example GaAs material system. FIG. 9 is a plot of momentum scattering rates for phonon scattering and scattering due to the introduction of a conventional ionized dopant impurity at the optimum Fermi level of −5 meV. Also plotted is the scattering rate for a core-shell dopant particle that is combination of the Z=0 and Z=1 particles of Table I, resulting in average Z=0.1 charges per nanoparticle and for a core-shell dopant particle that is the Z=2 particle of Table I.

As shown in the plot, by replacing conventional impurity dopant atoms with anti-resonant particles designed with the methodology above, the scattering is reduced and the mobility and Seebeck coefficient increased. But it is recognized that while a lower scattering rate enhances mobility, if the scattering is too low, then its sharp features are affected by the background phonon scattering. It is then preferred to increase the amplitude of the scattering, so that the sharp features are visible and result in the enhanced Seebeck coefficient. As shown in the plot of FIG. 9, the scattering rates are different for the two core-shell particle examples given. The Z=2 dopant particles produce a relatively flatter profile, thereby maintaining the Seebeck coefficient, while the Z=0.1 dopant particles enhance the Seebeck coefficient while only moderately increasing the charge carrier mobility. This demonstrates the importance of explicitly designing the scattering rate.

The plots of FIGS. 10A-10D illustrate the power factor enhancement that can be achieved for the example dopant center design given just above. In the plots, there is shown the electrical conductivity, σ, the Seebeck coefficient, S, and the product of $\sigma S^2 T$ for the GaAs host material given above, at 50 K, and for various dopants in the material. The dopants considered in the plotted data include a conventional ionized impurity atom; a Z=2, homogeneous nanoparticle of 3 nm radius; and the two core-shell dopant particles described above with reference to FIG. 9, with Z=0.1 and Z=2. The Matthiessen rule was used to add the momentum scattering rates of acoustic phonons, polar optical phonons, neutral impurities, ionized impurities and/or designed dopant scattering centers to obtain the total momentum scattering rate $(1/\tau_f)$ for the conditions plotted.

In the plots, the bottom of the conduction band is set to zero. In order to increase the carrier concentration and therefore the Fermi level of the host material, it is required to increase the volume fraction of the dopant scattering centers. In this example, the volume fraction of scattering centers was not increased beyond 10% because the partial wave framework employed in the methodology above is only valid in the dilute limit, and here the interest is not in multiple scattering effects, even though such scattering effects might lead to further enhancements in the power factor.

As shown in the plots of FIGS. 10A-10D, both of the designed core-shell dopant centers enhance the power factor of the material. The Z=0.1 core-shell dopant center produces simultaneous enhancement in the Seebeck coefficient and the electrical conductivity. The Z=2 core-shell particle produces a very large mobility enhancement, but the Seebeck coefficient is in this case almost the same as for a conventional impurity atom-doped sample. But it is clear that the Z=2 core-shell particle produces a larger increase in the power factor. That is, for the example GaAs system here, it is more beneficial to sacrifice the Seebeck coefficient to obtain a significantly enhanced charge mobility. Neverless, this demonstrates that it is possible to simultaneously enhance the Seebeck coefficient and the electrical conductivity by designing the degree of scattering center cloaking for achieving a desired enhancement in mobility.

Considering the Z=2 core-shell particle of Table I for enhancing charge carrier mobility, the scattering center design methodology herein can be considered to replace the conventional technique of uniformly distributing single dopant impurities with a technique in which dopant impurities are explicitly incorporated into designed particles that are introduced to a host material. If the core section of the Z=2 core-shell particle is considered as the entire nanoparticle (npt) in the plots of FIG. 10A-D, about 50% enhancement in the power factor is observable over the conventional ionized atom impurity-doped samples. But as shown in the plots, with the addition of the shell layer to the nanoparticle, to shield the ionized centers and cloak, or screen, the centers from conducting charge carriers, resulting in the Z=2 core-shell particle of Table I, there is obtained more than an order of magnitude enhancement in the power factor.

In the design of dopant particles, it is to be recognized that as the temperature of a host material is increased, the phonon scattering regime is reached, in which phonon scattering dominates and strategies for reducing dopant center scattering are unproductive. Further, at higher temperatures, the window of increased charge carrier mobility as a function of energy, i.e., the range of Femi energies of increased charge carrier mobility, is widened to due dependence on temperature, and the scattering cross section profile is flattened, reducing the Seebeck coefficient. A wider mobility-enhancement window can be preferred at higher temperatures. For the Z=0.1 and Z=2 core-shell particles considered in the analysis above with reference to the plots of FIGS. 10A-10D, the power factor enhancement is found to decrease as the temperature is increased, and no enhancement is achieved above room temperature. FIGS. 11A-11D plot the characteristics of FIGS. 10A-10D at a GaAs temperature of 100 K, for the two core-shell particle designs considered in FIGS. 10A-10D, to illustrate the decrease in enhancement with temperature increase.

The description above demonstrates that the design of dopant scattering centers can be tailored for any suitable application, e.g., to enhance the power factor of a thermoelectric material. The approach is most useful for this application at relatively low temperatures, e.g., at temperatures below about room temperature, and when the free electrical charge carriers are provided by the designed dopant scattering center particles. The introduction of such dopant scattering center particles can be employed to enhance both the electrical conductivity and the Seebeck coefficient of a host material simultaneously. Furthermore, a thermal conductivity reduction is achieved when there is a large acoustic mismatch between the dopant scattering center particle and the host material. In this sense, there can be simultaneously improved all three parameters relevant to the thermoelectric figure of merit, ZT, to achieve a figure of merit greater than about 0.5 at temperatures less than about 100 K, and more than an order of magnitude enhancement in the thermoelectric power factor can be achieved.

A wide range of other applications can be addressed by the scattering center design methodology above. It is recognized that for the wide range of applications to which the scattering center design methodology is applicable, there is a correspondingly wide range of materials to be employed. The solid state material in which scattering centers are to be introduced can be organic or inorganic, and can be a single crystalline, polycrystalline, or amorphous material, whether hard, glassy, or soft. The material can be homogeneous, can be provided as a heterostructure, a superlattice, or other selected arrangement, with any selected micro-structure and nano-structure topology and/or electrical or electromechanical devices and systems. The material can be formed in any suitable configuration, e.g., a substrate, wafer, or other structure, including, e.g., a wire, a nanowire, a layer, membrane or other suspended structure, or other configuration. Example solid state materials that can be particularly well-suited for a range of applications include semiconducting materials, including, e.g., II-VI and III-V materials, conventional thermoelectric materials, such as GaAs and its alloys, e.g., InGaAs and AlGaAs, Si, Ge and their alloys, SiGe alloys, half-heuslers, PtBe, PbSe, SnTe, PbTe, $Bi_2Te_3$, skutterudites, and other materials. Soft host materials can be employed, such as electrically conductive polymers, e.g., poly(3,4-ethylenedioxythiophene) poly(styrenesulfonate), known as PEDOT:PSS, and other suitable polymers.

Scattering centers to be intentionally introduced into a material can be fabricated separately and then introduced into the host material in any convenient manner. The scattering centers can be designed to be ionized such that one or more material regions of the scattering center donate free charge carriers to a host matrix material in which the scattering center is introduced. Any suitable material that can meet the design specifications for achieving cloaking of the scattering center can be employed. The scattering centers can be homogeneous, or can be nonhomogeneous in an arrangement of distinct materials, e.g., in a core-shell arrangement or other configuration. The scattering centers thereby can be provided with isotropic or anisotropic effective mass. The example core-shell particles described above can be provided with any suitable arrangement of materials, and with multiply nested shells. The core can be provided as any arrangement of selected materials, and alternatively can be hollow.

Materials that are semiconducting or conducting can be preferred for the scattering center material. II-VI and III-V semiconducting materials, metals, metal alloys, and various conducting and semiconducting compounds can be employed. The cloaking particles and the design methodology provided herein are not limited to a particular material or class of materials, and the listing of materials herein is only meant to provide representative examples. With the design methodology above, there are specified the characteristics of materials that are suitable for a given cloaking application, and some experimentation can be required to optimize materials and material conditions. It is expected that a range of materials and scattering center geometries yet to be realized by current technology will suitably operate as cloaking particles, and such are contemplated herein. Example scattering center materials include Si—Ge and Si—Ge alloys, GaAs/AlGaAs, PbTe/PbSe, half-heuslers, and full-heuslers, as well as a range of unconventional materials, such as C60 'buckyballs,' which can be doped with a single or multiple dopants. Other scattering center materials include metallic particles such as gold, aluminum and silver, which all can be coated with metallic materials having different work functions. The core-shell particles can further be conjugated polymers such as PEDOT and other suitable polymers.

In the production of scattering center particles, the example core-shell particles described above can be manufactured in any suitable manner, using conventional techniques. Core-shell particle synthesis can be conducted, e.g., by wet chemistry processing such as sol-gel and precipitation techniques, by electrochemical synthesis, self assembly, or atomic layer deposition.

Whatever scattering center particle geometry is employed, the manufactured scattering center particles can be introduced into a selected host matrix material in any suitable manner, and no particular process is required. For example, if atomic layer deposition is employed for nanoparticle synthesis, then the synthesized nanoparticles can be embedded in a host material with the same technique, with multiple layers of host material grown prior to production of a layer of core-shell nanoparticles, forming, e.g., an array of nanoparticles in the host material, and followed by additional growth of the host material to cover the array of nanoparticles. Nanoparticles can also self-assemble in a host material, e.g., in a host material, such as GaAs or silicon, that is grown by molecular beam epitaxy. Additionally, using wet chemistry techniques, stable core-shell nanoparticles can be directly added to a host material precursor solution so that the host material with embedded core-shell nanoparticles is be synthesized with a random distribution of nanoparticles. Thus, the scattering center particles can be arranged uniformly or non-uniformly in a host material, e.g., in an array, a sequence, such as a chain, or other geometric arrangement, such as layers or other three-dimensional configuration.

The techniques for cloaking scattering centers in a three-dimensional solid state material can be extended to a two-dimensional environment of electrical charge carriers. The cloaking of scattering centers in a three-dimensional material is for many applications primarily employed for enhancing charge carrier mobility in a material environment that includes an elevated concentration of scattering centers due to the introduction of dopant species. In a two-dimensional material environment of electrical charge carriers, the cloaking techniques can be employed for screening scattering centers that intrinsically exist in the material environment, e.g., defects, dangling bonds, and impurities in the material lattice.

For many applications of two-dimensional electrical charge carrier environments, the cloaking methodology is particularly well-suited to impose electrostatic potentials on the environment that artificially cause scattering of charge carriers outside of a range of preselected charge carrier energies, e.g., by means of electrode gating of the environment. Here, cloaking of the gated potential results in an effective filter, capable of filtering a narrow and prespecified range of electron energies at which carrier mobility is significantly higher than outside the filter range. In other words, by designing voltage gating to meet the cloaking requirements, the mobility of charge carriers can be preferentially enhanced in a prespecified Fermi level energy range for which the potentials are designed. As a result, the cloaking methodology implements a charge carrier filter that is tunable to a prespecified energy range.

In one example of a two-dimensional environment of electrical charge carriers, consider a two-dimensional electron gas (2DEG), like that formed at a heterojunction such as a GaAs/AlGaAs heterojunction. In a 2DEG at such a heterojunction, the dynamics of the electrons near the band edges can be described by the Schrödinger equation with effective mass specified therein, and the formalism given above for three-dimensional environments is therefore applicable here. Other 2DEG environments to which the cloaking techniques can be applied include, e.g., III-V materials and heterostructures, such as GaN-AlGaN, InAs, and their combinations, and Si/Ge interfaces, among other.

For these 2DEG environments, there is considered a finite-range circularly symmetric scattering potential, V(r), defined for the 2DEG cases in radial coordinates. To describe the result of a scattering event quantitatively in 2D, a differential scattering width, w(θ), that is analogous to the scattering cross section in 3D, is defined as:

$$w(\theta)d\theta = \frac{N(\theta)}{P} \tag{34}$$

where N(θ) is the number of charge carriers that are scattered into a differential angle dθ at θ per unit time by a scattering center, and P is the incident charge carrier flux, having the dimensions of number per unit time per unit length. To derive a relation between the differential scattering width, w(θ), and the scattering amplitude, $f(\theta)$, first it is noted that the incident flux, P, is proportional to the amplitude and the phase velocity of the incident plane wave of a charge carrier as:

$$P = |A|^2 v. \tag{35}$$

On the other hand, the outgoing charge carrier flux, J, is given as:

$$J = \frac{i\hbar}{2m}(\psi \nabla \psi^* - \psi^* \nabla \psi) = \frac{v|A|^2|f(\theta)|^2}{r} \tag{36}$$

as the leading term. Therefore the outgoing particle number per unit time N(θ) is given as:

$$N(\theta) = J \cdot r d\theta = v|A|^2 |f(\theta)|^2 d\theta. \tag{37}$$

Thus the differential scattering width w(θ) is given by:

$$w(\theta) = \frac{N(\theta)}{Pd\theta} = |f(\theta)|^2 \tag{38}$$

Once the scattering amplitude, $f(\theta)$, is known, the total scattering width can be calculated with the above expressions. To determine the scattering amplitude, notice that it is given as part of the boundary condition for solving the Schrödinger equation inside the region of interest of the 2DEG that is characterized by a scattering potential. Given the rotational symmetry of the formalism, a general solution of the Schrödinger equation can be given as a summation as:

$$\psi(r, \theta) = \sum_{m=-\infty}^{+\infty} i^m A_m R_m(r) e^{im\theta}, \tag{39}$$

where m are integers, $R_m(r)$ are radial wave functions, $A_m$ are constant coefficients to be determined, and $i^m$ are constant factors for later convenience. Employing this expression in a 2D Schrödinger equation in polar coordinates gives a set of radial equations, which take the form at r→∞ as:

$$\rho^2 \frac{\partial^2}{\partial \rho^2} R_m(\rho) + \rho \frac{\partial}{\partial \rho} R_m(\rho) + (\rho^2 - m^2) R_m(\rho) = 0, \tag{40}$$

where ρ=kr, and $$k = \frac{\sqrt{2mE}}{\hbar}$$

is the wave number. There is no scattering potential term in this expression because a finite-range potential is being considered, which vanishes outside of a certain cut-off radius. This expression is a normal Bessel equation, the solutions of which are linear combinations of the first and second kind Bessel functions, $J_m(\rho)$ and $Y_m(\rho)$. This observation indicates that for a finite-range scattering potential within the 2DEG, the solutions of the radial equations outside of the scattering potential range of interest are linear combinations of Bessel functions. Given the asymptotic behaviors of the Bessel functions as:

$$J_m(\rho) \xrightarrow{r \to \infty} \sqrt{\frac{2}{\pi \rho}} \cos\left(\rho - \frac{m\pi}{2} - \frac{\pi}{4}\right) \tag{41}$$

and $$Y_m(\rho) \xrightarrow{r \to \infty} \sqrt{\frac{2}{\pi \rho}} \sin\left(\rho - \frac{m\pi}{2} - \frac{\pi}{4}\right), \tag{42}$$

then a general solution of Expression (40) can be written as:

$$R_m(kr) = aJ_m(kr) + bY_m(kr) \xrightarrow{r \to \infty} c\sqrt{\frac{2}{\pi kr}} \cos\left(kr - \frac{m\pi}{2} - \frac{\pi}{4} + \delta_m\right), \tag{43}$$

where $c = \sqrt{a^2 + b^2}$ and $$\delta_m = \arctan\left(-\frac{b}{a}\right)$$

is the phase shift for the $m^{th}$ "partial wave". After substituting Expression (43) into Expression (39), and incorporating the constant factor c into $A_m$, the asymptotic form of a general solution to the Schrödinger equation can be obtained as:

$$\psi(r, \theta) = \sum_{m=-\infty}^{+\infty} i^m A_m \sqrt{\frac{2}{\pi kr}} \cos\left(kr - \frac{m\pi}{2} - \frac{\pi}{4} + \delta_m\right) e^{im\theta}. \tag{44}$$

Now a boundary condition can be applied as:

$$\psi(r, \theta) \xrightarrow{r \to \infty} A\left[e^{ikx} + \frac{f(\theta)}{\sqrt{r}} e^{ikr}\right]. \tag{45}$$

First, the circular decomposition of the plane wave in Expression (45) is given as:

$$e^{ikx} = e^{ikr\cos\theta} = \sum_{m=-\infty}^{+\infty} i^m J_m(kr)e^{im\theta} \xrightarrow{r\to\infty} \sum_{m=-\infty}^{+\infty} i^m \sqrt{\frac{2}{\pi kr}} \cos\left(kr - \frac{m\pi}{2} - \frac{\pi}{4}\right)e^{im\theta} \quad (46)$$

Combining Expressions (44-46) then gives:

$$\sum_{m=-\infty}^{+\infty} i^m A_m \sqrt{\frac{2}{\pi kr}} \cos\left(kr - \frac{m\pi}{2} - \frac{\pi}{4} + \delta_m\right)e^{im\theta} = \sum_{m=-\infty}^{+\infty} i^m \sqrt{\frac{2}{\pi kr}} \cos\left(kr - \frac{m\pi}{2} - \frac{\pi}{4}\right)e^{im\theta} + \frac{f(\theta)}{\sqrt{r}}e^{ikr} \quad (47)$$

Writing the cosine functions as combinations of exponentials to describe the incoming and outgoing spherical matter waves of charge carriers gives this expression as:

$$\cos\left(kr - \frac{m\pi}{2} - \frac{\pi}{4}\right) = \frac{\exp\left[i\left(kr - \frac{m\pi}{2} - \frac{\pi}{4}\right)\right] + \exp\left[-i\left(kr - \frac{m\pi}{2} - \frac{\pi}{4}\right)\right]}{2} \quad (48)$$

and matching the coefficients in front of both the outgoing wave $e^{ikr}$ and ingoing wave $e^{-ikr}$ as:

$$\sum_{m=-\infty}^{+\infty} A_m i^m \sqrt{\frac{2}{\pi kr}} \frac{\exp\left[i\left(-\frac{m\pi}{2} - \frac{\pi}{4} + \delta_m\right)\right]}{2} e^{im\theta} = \sum_{m=-\infty}^{+\infty} i^m \sqrt{\frac{2}{\pi kr}} \frac{\exp\left[i\left(-\frac{m\pi}{2} - \frac{\pi}{4}\right)\right]}{2} e^{im\theta} + \frac{f(\theta)}{\sqrt{r}} \quad (49)$$

$$\sum_{m=-\infty}^{+\infty} A_m i^m \sqrt{\frac{2}{\pi kr}} \frac{\exp\left[i\left(\frac{m\pi}{2} + \frac{\pi}{4} - \delta_m\right)\right]}{2} e^{im\theta} = \sum_{m=-\infty}^{+\infty} i^m \sqrt{\frac{2}{\pi kr}} \frac{\exp\left[i\left(\frac{m\pi}{2} + \frac{\pi}{4}\right)\right]}{2} e^{im\theta}. \quad (50)$$

From Expression (50) the coefficients $A_m$ can be solved as $A_m = e^{i\delta_m}$, and this gives, in Expression (49) the scattering amplitude as:

$$f(\theta) = \sum_{m=-\infty}^{+\infty} (e^{i2\delta_m} - 1)i^m \frac{1}{\sqrt{2\pi k}} \exp\left[-i\left(\frac{m\pi}{2} + \frac{\pi}{4}\right)\right]e^{im\theta} = \frac{\exp\left(-i\frac{\pi}{4}\right)}{\sqrt{2\pi k}} \sum_{m=-\infty}^{+\infty} (e^{i2\delta_m} - 1)e^{im\theta}, \quad (51)$$

where the fact that $$\exp\left(-i\frac{m\pi}{2}\right) = \frac{1}{i^m}$$

is utilized. The total scattering potential width, w, can be given by inserting the result of Expression (51) into Expressions (34) and (38), as:

$$w = \int_0^{2\pi} |f(\theta)|^2 d\theta = \frac{1}{2\pi k}\int_0^{2\pi} \left|\sum_{m=-\infty}^{+\infty}(e^{i2\delta_m}-1)e^{im\theta}\right|^2 = \frac{1}{2\pi k}\int_0^{2\pi}\sum_{m=-\infty}^{+\infty}|(e^{i2\delta_m}-1)e^{im\theta}|^2 = \frac{4}{k}\sum_{m=-\infty}^{+\infty}\sin^2\delta_m \quad (52)$$

where the orthogonality of the set $\{e^{im\theta}, m=0,\pm 1\ldots\}$ and the equality $e^{i2\delta_m}-1 = e^{i\delta_m}\cdot 2i\sin\delta_m$ is exploited.

Now the specific phase shifts of each partial wave of a charge carrier matter wave in a 2DEG can be specified, by matching the logarithmic derivative $$\frac{\psi'}{\psi}$$

of the wave function outside of the scattering potential region of interest, specified by Expression (43), with that of the wave function for the matter wave inside the scattering potential region, which can be solved analytically for most cases of interest, such as constant scattering potential, and numerically otherwise, at the cut-off radius of the potential, $r_c$.

Assume the logarithmic derivative of the wave function inside the potential region at $r_c$ is $\gamma_m$, then the boundary matching gives:

$$\gamma_m = \frac{\psi'}{\psi}\bigg|_{r=r_c} = \frac{akJ'_m(kr_c) + bkY'_m(kr_c)}{aJ_m(kr_c) + bY_m + (kr_c)}, \quad (53)$$

from which the phase shifts, $\delta_m$, can be solved as:

$$\delta_m = \arctan\left(-\frac{b}{a}\right) = \arctan\left(\frac{kJ'_m(kr_c) - \gamma_m J_m(kr_c)}{kY'_m(kr_c) - \gamma_m Y_m(kr_c)}\right). \quad (54)$$

Expression (54) implies that the radial equations for the partial waves with $\pm|m|$ are the same, and thus their logarithmic derivatives are also the same, with $\gamma_{|m|} = \gamma_{-|m|}$. Given the properties of Bessel functions of $J_{-|m|}(\rho) = (-1)^{|m|}J_{|m|}(\rho)$, $Y_{-|m|}(\rho) = (-1)^{|m|}Y_{|m|}(\rho)$, then $\delta_{|m|} = \delta_{-|m|}$ and Expression (52) for the scattering width, w, can be given as:

$$w = \frac{8}{k}\left(\frac{1}{2}\sin^2\delta_0 + \sum_{|m|=1}^{\infty}\sin^2\delta_{|m|}\right). \quad (55)$$

This expression for scattering width in a 2D charge carrier environment corresponds to Expression (18) above for the scattering cross section in a 3D charge carrier environment. In both cases, the scattering region is defined by a sum of periodic sine functions of the phase shifts of partial waves. In this case, contributions from different partial waves to the summation of 2D scattering width have the same weight, unlike the 3D environment. As a result, residual scattering from higher order partial waves plays a very small role, and is much less important than in the 3D case.

To impose selected phase shifts on partial waves in a 2DEG environment, there can be employed the application of localized voltage biasing, rather than the introduction of scattering centers, at one or more 2DEG regions. It is relatively straightforward to control the electrostatic scattering potential in a selected region of a 2DEG environment by selected voltage gating, and this technique obviates the need to introduce scattering centers into the region for controlling partial matter wave phase shifts in the 2DEG environment.

Figure 12:
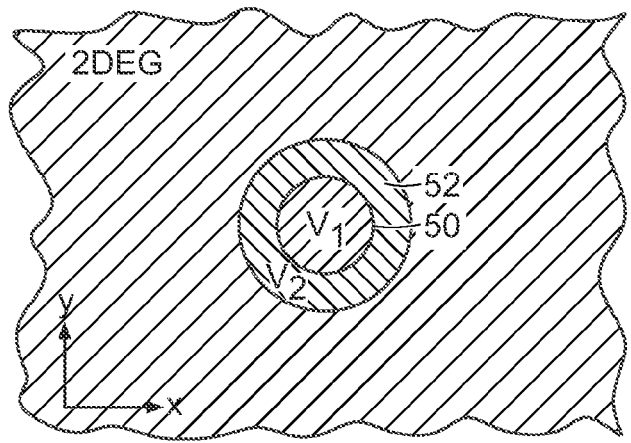
FIG. 12 is a schematic top-down view of two concentric electrodes, each connected separately to a voltage, for imposing a scattering potential on a two dimensional electron gas (2DEG) in a material on which the electrodes are disposed.

Referring to FIG. 12, there can be produced such a localized voltage bias condition by providing one or more electrodes on one or more surfaces of a 2DEG material environment. The electrode or electrodes can take any suitable form and geometry, and can be provided in a selected arrangement, e.g., as one or more top and back gates, as one or more top gates, one or more back gates, or other electrode arrangement to impose one or multiple distinct potentials in a localized region of the 2DEG environment. In one example of such, shown in FIG. 12, there are provided two electrodes, 50, 52, each being connected separately to one or more voltage sources. The first electrode 50 is of a radius $a_c$, and is connected, e.g., in a first circuit, to impose a first voltage, $V_1$, on the material. The radius from the center of the first electrode to the outer edge of the second electrode 52 is radius a, and the second electrode is connected, e.g., in a second circuit, to impose a second voltage, $V_2$, on the material. The outer circumferential electrode 52 does not overlap with the inner electrode 50, and the inner electrode can be laterally electrically insulated from the outer electrode for most applications, e.g., with a thin insulating layer. Both electrodes can be electrically insulated from the 2DEG by an underlying insulating layer.

With this example arrangement, two concentric localized voltages can be imposed on the 2D environment, in the manner of a core-shell scattering center having differing radii, like that arrangement described above. It is to be recognized that this is but one example electrode configuration, and others can be employed. For example, a first voltage can be uniformly imposed across an entire 2D layer and additional control voltages applied at one or more electrodes positioned on the layer. An array of electrodes, or a particular geometry of electrodes can be employed to impose the desired potentials for controlling electrical charge mobility in the 2DEG.

Following the approach given above for the 3D environment, the cloaking parameters can be solved here to determine the potentials to be imposed on the material, by enforcing voltages that cause the contributions from the first two partial waves of the charge carrier matter wave to vanish. The effect of potential barriers and potential wells on radial Bessel functions follows the same behavior as that on spherical Bessel functions as discussed above. Just as in the 3D example above, here a prespecified energy for which charge carrier mobility is to be enhanced is selected, and then the corresponding electron wave number is calculated as in the 3D environment. Now knowing the prespecified Fermi level energy at which a mobility peak is desired and the corresponding electron wave number, the size of the gating electrode region is designed such that the condition $ka \le 1$ is satisfied, where a is the radius of the electrode, e.g., outer radius of the example core-shell electrode configuration in FIG. 12, With this geometry specified, all that remains is determination of the electrode voltages that produce the desired electrostatic potential in the material. To make this determination, for the example electrodes of FIG. 12, candidate values for the voltages on the inner and outer electrodes are swept along opposite directions, and there are identified those values that make the phase shifts of the lowest two partial waves equal to $\pi$ or a multiple of $\pi$. The phase shifts are determined based on Expressions (53)-(55). The intersection generates the solution of the voltages that produce the desired cloaking potential at the prespecified energy.

Figure 13:
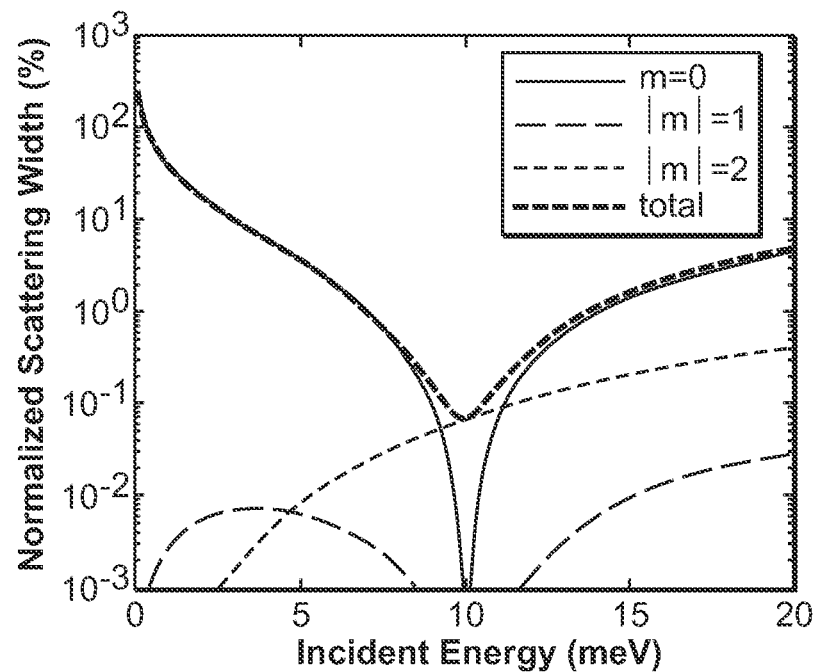
FIG. 13 is a plot of scattering width as a function of incident electron energy for the $0^{th}$, $1^{st}$, and $2^{nd}$ partial waves of an electron traveling in the material of FIG. 12 in the vicinity of the electrodes of FIG. 12.

An example of this analysis is shown in the plot of FIG. 13. In this example, a cloaking energy of 10 meV is selected as that incident electron energy for which charge carrier mobility is to be enhanced relative to other electron energies. For the example arrangement of electrodes shown in FIG. 12, the design methodology just given prescribes an inner electrode radius, $a_c$, of 1.5 nm and an outer electrode radius, a, of 2 nm, with an inner electrode voltage, $V_1$=0.019 eV and an outer electrode voltage, $V_2$=−1.573 eV. The effective mass of the host material in which the 2DEG is provided is given as $m_0$=1. FIG. 13 includes a plot of the scattering width as a function of incident electron energy for the $0^{th}$, $1^{st}$, and $2^{nd}$ partial waves. The plotted scattering widths are normalized to the physical width of the 2a of the gated region. At the prespecified cloaking Fermi energy of 10 meV, the scattering width is reduced to less than about 0.1% of the physical width of the scattering region, that is, the physical width of the electrodes.

To vary the incident energy of the charge carriers in the 2DEG environment analyzed in the plots of FIG. 13, the Fermi level of the 2DEG is adjusted, e.g., by doping the 2DEG environment with scattering centers that are designed based on the methodology given above or more preferably, by employing a global back gate electrode that is connected in a circuit to impose a selected global voltage across the 2DEG environment to shift the Fermi level of the environment. Alternatively, the voltage on one or more of the electrodes is adjusted or switched to change the electrostatic scattering potential in the region of the electrodes. For example, considering the concentric electrode arrangement of FIG. 12, one or both of the electrode voltages, $V_1$ and $V_2$ can be adjusted to correspondingly change the phase shifts of the partial waves of an incident matter wave.

Figure 14:
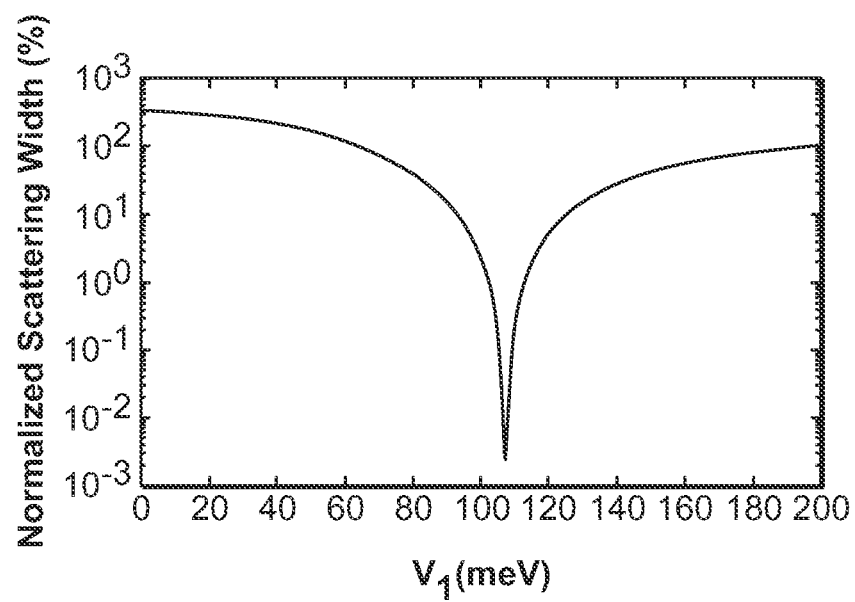
FIG. 14 is a plot of normalized total scattering width as a function of the voltage applied to the inner electrode of FIG. 12, for a preselected mobility peak at inner electrode voltage of 0.107 eV.

For example, in the concentric electrode arrangement of FIG. 12, it can be chosen to hold fixed one of the applied voltages, e.g., $V_2$, and to adjust the other applied voltage, $V_1$, for controlling the scattering rate of charge carriers in the 2DEG environment off the cloaking region, in the manner of a switch, by controlling the applied voltage, $V_1$. In one example of such, a GaAs/AlGaAs 2DEG environment can be considered, with an effective mass of the 2DEG of $0.072m_0$. Using the above methodology imposed on a concentric electrode arrangement like that of FIG. 12, there can be designed the electrodes for achieving a peak in charge carrier mobility at a preselected incident energy. In this example, the voltage of the outer concentric electrode is held fixed at $V_2$=−5.448 eV and the voltage of the inner electrode is controlled. For an inner electrode radius, $a_c$=3 nm and a total outer electrode radius, a=4 nm, an inner electrode voltage, $V_1$, that causes a peak in mobility is at $V_1$=0.107 eV. FIG. 14 is a plot of the total scattering width in the 2DEG as a function of the inner electrode voltage, $V_1$. The drop in scattering width, and corresponding peak in mobility, is extraordinarily sharp at the design voltages, with a drop in scattering width of four orders of magnitude in a range of about 20 meV around the prespecified cloaking potential of $V_1$=0.107 eV.

This dramatic switching in mobility can be exploited in a switching device configuration, such as that shown in FIGS.

Figure 15A:
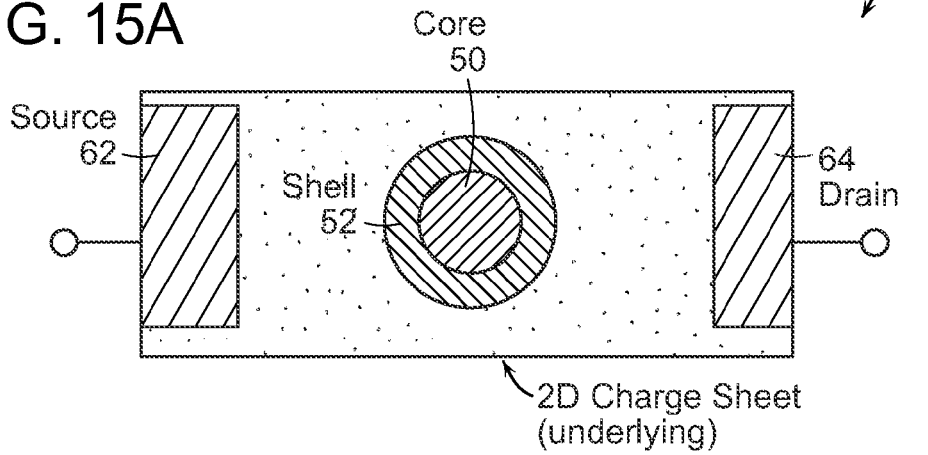
FIGS. 15A-C are schematic top down and side views of a 2DEG device employing the electrode arrangement of FIG. 12.

15A-C. In FIG. 15A there is shown a planar, top down, schematic view of such a switch 60, implemented for a 2DEG environment that is achieved by a heterojunction interface. The switch 60 includes the core 50 and shell 52 planar control electrodes shown in FIG. 12. Electrodes are further provided for a source 62 and a drain 64. The source and drain electrodes are connected in a circuit such that current flow through the device is enabled, and such that a voltage can be applied to control the charge carrier incident energy, which is around the Fermi level energy. As shown in the cross-sectional views of FIGS. 15B and 15C, a 2DEG environment is provided by, e.g., a 2D charge sheet that exists at the interface between two materials, e.g., a first semiconductor 68 and a second semiconductor 70. The voltages applied to the electrodes are controlled to cause scattering center cloaking in the 2DEG at a prespecified charge carrier energy and prespecified voltage levels.

Figure 15B:
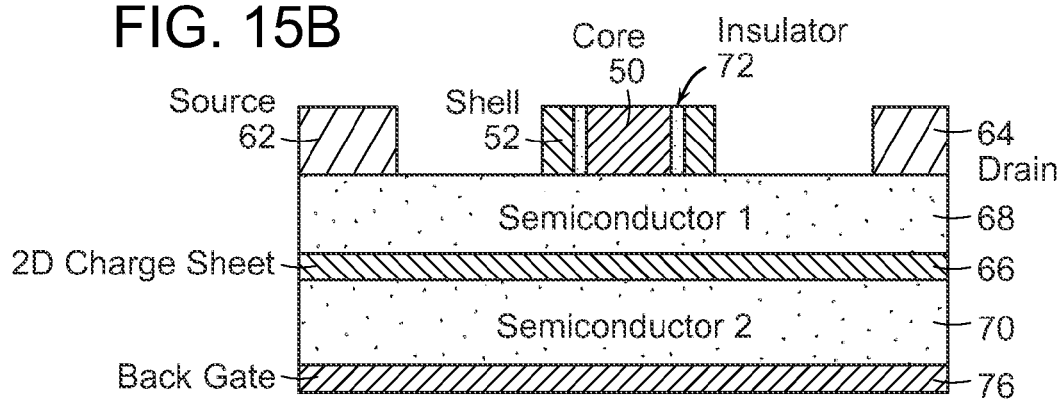
Figure 15C:
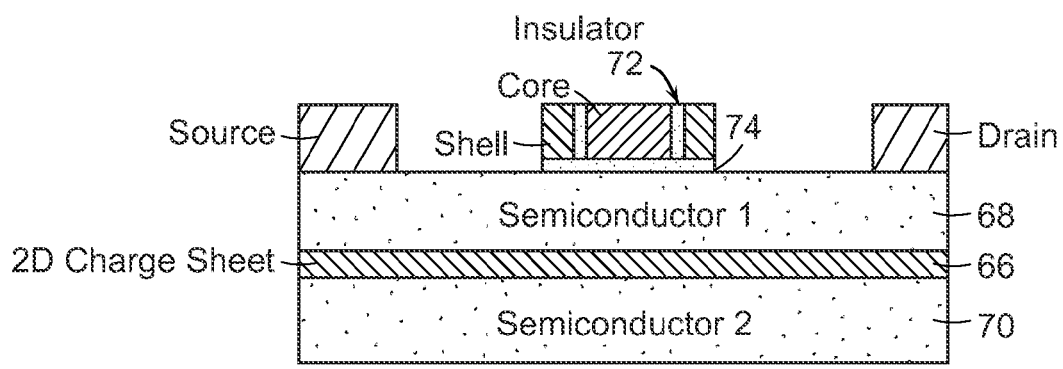

As shown in the cross-sectional views of FIGS. 15B-C, the planar core and shell electrodes are disposed at a location between the source and drain electrodes, on a surface of one of the semiconductors. An insulator 72 is disposed laterally between the inner electrode and the outer electrode. An insulator 74 further can be disposed under the electrodes, on the surface of the semiconductor, if necessary, but such is not in general required. A back gate 76 can be included on the surface of one of the semiconductors, if desired, to provide global control of the potential. With this arrangement, the voltages of one or both of the control electrodes 50, 52 can be controlled to switch the mobility in the 2DEG such that at a prespecified control voltage, the current level is correspondingly switched. The current switching function like that in the plot of FIG. 14 can therefore be imposed on the device for a corresponding design in the electrodes and the applied voltages. This is but one example of a switching device that can be implemented based on the scattering center cloaking methodology.

The switch device of FIGS. 15A-C can be provided for any in a wide range of materials, and other such devices can be implemented for control of scattering width. Heterojunction configurations, such as the GaAs/AlGaAs interface, the LaAlO$_3$/SrTiO$_3$ interface, and a GaAs/InGaAs/GaAs quantum well can be thusly arranged. In addition novel 2D semiconducting materials such as MoS$_2$ and silicene can be used. No particular material combination is required.

The behavior of charge carriers in the class of 2DEG environments described above follows the Schrödinger equation, with an effective mass imposed on the relation given an assumption of parabolic band structure, but it is recognized that not all 2DEG environments provide this characteristic. For example, for a class of atomic-scale materials such as graphene, there is followed the Dirac equation, rather than the Schrödinger equation formalism given above. For this second class of 2DEG environments, the cloaking methodology can also be specified. Such enables the ability to impose on graphene or other material an electrostatic potential that controls the scattering of charge carriers through the material.

Considering the example of graphene explicitly, suppose an external macroscopic scattering potential, $V_{ext}(r)$, is applied to a graphene sheet. The so-called "envelope function approximation" can here be used to derive the "effective mass equation" for electrons in graphene. For simplicity, assume $V_{ext}(r)$ is weak, so that the potential can be treated as a perturbation to the original system. As a standard procedure in the perturbation theory, the perturbed wave function, $\psi(r)$, due to the external potential is expanded in the basis of the unperturbed eigenstates, $\psi_{n,k}(r)$, as:

$$\psi(r) = \sum_n \int \frac{d^3k}{(2\pi)^3} c_n(k)\psi_{n,k}(r) \qquad (56)$$

In the case of graphene, of interest is the perturbed wave function near the "band edges"—the Dirac cones. For this purpose, assume the interactions between the two π bands, the conduction and the valence band, and the other bands are weak and thus the matrix elements between states with different n labels (except for the two π bands in consideration) can be ignored. Denote the two degenerate states at K as $\psi_{AK}(r)$ and $\psi_{BK}(r)$, and move the origin of the reciprocal space to K (namely, k is measured from K). thus Expression (56) can be modified to:

$$\psi(r) = \int \frac{d^2k}{(2\pi)^3} c_A(k)\psi_{Ak}(r) + \int \frac{d^2k}{(2\pi)^2} c_B(k)\psi_{Bk}(r) \qquad (57)$$
$$\approx \int \frac{d^2k}{(2\pi)^2} c_A(k)e^{ik\cdot r}\psi_{Ak}(r) + \int \frac{d^2k}{(2\pi)^2} c_B(k)e^{ik\cdot r}\psi_{Bk}(r)$$
$$= F_{AK}(r)\psi_{AK}(r) + F_{BK}(r)\psi_{BK}(r)$$

where the approximation $\psi_{Ak}(r) \approx e^{ik\cdot r}\psi_{AK}(r)$ is based on a standard k·p scheme and $F_{AK}(r)$ and $F_{BK}(r)$ are so-called "envelope functions," given as:

$$F_{A,BK}(r) = \int \frac{d^2k}{(2\pi)^2} c_{A,B}(r)e^{ik\cdot r}. \qquad (58)$$

Thus the perturbed wave functions are approximated as the unperturbed wave functions times "envelopes" that are to be determined. In this way, the original problem of solving for the perturbed wave functions is converted to that of solving for the "envelope functions." The dynamic equation for the "envelope functions" is the so-called "effective mass equation," which can be derived by inserting Expression (57) in the original Schrödinger equation. In the case for graphene, since two envelope functions are needed to describe the perturbed wave function, it is expected there will be two coupled "effective mass equations". The final result for the Dirac equation is:

$$H_K \begin{pmatrix} F_{AK}(r) \\ F_{BK}(r) \end{pmatrix} = v_F \begin{bmatrix} 0 & \hat{k}_x - i\hat{k}_y \\ \hat{k}_x + i\hat{k}_y & 0 \end{bmatrix} \begin{pmatrix} F_{AK}(r) \\ F_{BK}(r) \end{pmatrix} = \begin{pmatrix} F_{AK}(r) \\ F_{BK}(r) \end{pmatrix} \qquad (59)$$

The effective Hamiltonian for the envelope functions can be formally written as $H_K = v_F \sigma \cdot k$, where $\sigma = (\sigma_x, \sigma_y)$ are Pauli matrices. Similar equations can be derived for the wave functions near the K' point.

With this Hamiltonian, partial wave formalism for the elastic scattering of electrons in graphene can be specified. First consider the free-particle solution for Expression (59) cast in the cylindrical coordinates (r,θ). In the nonrelativistic case, the scalar spherical waves in the form of $\psi_{pm}(r) = R_{lm}(r)e^{im\theta}$ are the solutions of the Schrödinger equation in cylindrical coordinates, which is a direct consequence of the circular symmetry. Notice that, however, the angular momentum projected onto ẑ-axis $\hat{L}_z$ does not commute with the Dirac Hamiltonian:

$$[\hat{L}_z, H_K] = i\sigma \times p. \qquad (60)$$

Instead, the Dirac Hamiltonian commutes with the "isospin-orbital" momentum projected onto the ẑ-axis as:

$$\hat{j}_z = \hat{l}_z \frac{1}{2}\sigma_z, \qquad (61)$$

$$[\hat{j}_z, H_K] = 0$$

Thus the energy eigenstates can be labeled by the eigenstates of the operator $\hat{j}_z$:

$$\psi_{Ej}(r) = \begin{pmatrix} F_{Ej} e^{i(j-1/2)\theta} \\ iG_{Ej} e^{i(j+1/2)\theta} \end{pmatrix}, \qquad (62)$$

which satisfies the relation $\hat{j}_z \psi_{Ej}(r) = j\psi_{Ej}(r)$, where j is a half-integer and the factor i is provided for later convenience. Substituting Expression (62) back into the Dirac equation of Expression (59) gives:

$$-\frac{1}{r}\frac{d}{dr}\left(r\frac{dF_{Ej}(r)}{dr}\right) + \frac{(j-1/2)^2}{r^2} F_{Ej} = \left(\frac{E}{v_F}\right)^2 F_{Ej} \qquad (63)$$

$$-\frac{1}{r}\frac{d}{dr}\left(r\frac{dG_{Ej}(r)}{dr}\right) + \frac{(j+1/2)^2}{r^2} G_{Ej} = \left(\frac{E}{v_F}\right)^2 G_{Ej} \qquad (64)$$

With the substitution ρ=kr, where $$k = \frac{E}{v_F},$$

Expressions (63) and (64) are converted to Bessel equations with the solutions being the Bessel functions. To avoid the singularity at the origin, the general solutions for the free-particle Dirac equation in cylindrical coordinates are then given as:

$$\psi_{Ej}(r) = \qquad (65)$$

$$\frac{1}{\sqrt{2}}\begin{pmatrix} J_{j-1/2}(kr)e^{i(j-1/2)\theta} \\ \pm iJ_{j+1/2}(kr)e^{i(j+1/2)\theta} \end{pmatrix} \xrightarrow{r\to+\infty} \frac{1}{\sqrt{\pi k}}\begin{pmatrix} \cos\left(kr - \frac{j\pi}{2}\right)e^{i(j-1/2)\theta} \\ \pm i\sin\left(kr - \frac{j\pi}{2}\right)e^{i(j+1/2)\theta} \end{pmatrix},$$

where the ± sign corresponds to the sign of E, a fact that can be more easily appreciated in terms of the raising/lowering operators. Following the same argument presented above for 2DEG environments, it is assumed that the effect of a finite-range circularly symmetric potential on the "partial waves" in Expression (65) is a phase shift for the $j^{th}$ partial wave, $\delta_j$, and the general solution for scattered waves is given by the expansion:

$$\psi(r) \xrightarrow{r\to+\infty} \sum_{j=-\infty}^{+\infty} \frac{i^{j-1/2}A_j}{\sqrt{\pi kr}} \begin{pmatrix} \cos\left(kr - \frac{j\pi}{2} + \delta_j\right)e^{i(j-1/2)\theta} \\ \pm i\sin\left(kr - \frac{j\pi}{2} + \delta_j\right)e^{i(j+1/2)\theta} \end{pmatrix}. \qquad (66)$$

Now consider the scattering boundary conditions for this environment. Without loss of generality, it will be assumed that the incident electrons conducting through the graphene carry energy E>0. Thus the asymptotic form of the scattered wave function should be a combination of the incident plane wave and the scattered spherical wave as:

$$\psi(r) \xrightarrow{r\to+\infty} \frac{1}{\sqrt{2}}\begin{pmatrix} 1 \\ 1 \end{pmatrix}e^{ikx} + \frac{f(\theta)}{\sqrt{2r}}\begin{pmatrix} 1 \\ e^{i\theta} \end{pmatrix}e^{ikr}. \qquad (67)$$

Matching Expressions (66) and (67), generates the result for scattering as:

$$f(\theta) = \frac{1}{\sqrt{2i\pi k}} \sum_{j=\pm\frac{1}{2},\pm\frac{3}{2},\ldots} (e^{i2\delta_j} - 1)e^{i(j-1/2)\theta}, \qquad (68)$$

with the total scattering width then given by:

$$w = \frac{4}{k} \sum_{j=\pm\frac{1}{2},\pm\frac{3}{2},\ldots} \sin^2\delta_j = \frac{8}{k} \sum_{j=\frac{1}{2},\frac{3}{2},\ldots} \sin^2\delta_j, \qquad (69)$$

With the symmetry $\delta_j = \delta_{-j}$ being utilized here. With this Expression (69) the same strategy for designing electron cloaks in graphene can be demonstrated in the manner of the 2DEG environments discussed above.

A macroscopic circularly symmetrical potential V(r) couples to the Dirac Hamiltonian in the form:

$$H_K = v_F \sigma \cdot k + V(r). \qquad (70)$$

Thus if an imposed potential V(r) is constant in a certain graphene region, the general solution for the radial equation in that region is linear combinations of Bessel functions with the wave number modified to $$k = \frac{|E - V|}{v_F},$$

To impose control on the scattering rate of electrons in graphene, the requirement ka≤1 holds as explained previously, where a is the range of the imposed potential. Given $$v_F = \frac{3|t_{12}|a_0}{2}$$

and $|t_{12}|\approx 2.8$ eV, the requirement leads to a condition of:

$$a \leq \frac{3|t_{12}|}{2E}a_0 = \frac{4.2 \text{ eV}}{E} \times 1.42 \text{ Å}. \qquad (71)$$

For example, if the desired cloaking energy is chosen to be 100 meV, then this Expression (71) prespecifies the upper limit of a as about 6 nm.

In a graphene 2DEG, this condition sets the extent of the region in which a cloaking potential or potentials are to be imposed by electrodes provided on the graphene. In one example, consider the planar core-shell structured electrode top gating arrangement of FIG. 12, here imposed on a graphene layer, with the inner electrode radius, $a_c$, the electrostatic potential $V_1$ imposed by the inner electrode 50, and the outer radius, a, with an electrostatic potential $V_2$ imposed by the outer electrode 52. Then outside the region in which the potential is imposed, r>a, the two radial wave function components in Expression (62) are:

$$F_{j,r>a} = C[J_{j-1/2}(kr)\cos\delta_j - Y_{j-1/2}(kr)\sin\delta_j] \text{ and} \tag{72}$$

$$G_{j,r>a} = \text{sign}(E)C[J_{j+1/2}(kr)\cos\delta_j - Y_{j+1/2}(kr)\sin\delta_j]. \tag{73}$$

Similarly the wave function components in the region controlled by the inner electrode are given as:

$$F_{j,r<a_c} = A[J_{j-1/2}(\alpha r)], \text{ and}$$

$$G_{j,r<a_c} = \text{sign}(E-V_1)A[J_{j+1/2}(\alpha r)], \tag{74}$$

where $$\alpha = \frac{|E - V_1|}{v_F}$$

is the wave number in the graphene region controlled by the potential imposed by the inner electrode. The wave function components in the graphene region controlled by the potential imposed by the outer region are:

$$F_{j,a_c<r<a} = B[J_{j-1/2}(\beta r) + B'Y_{j-1/2}(\beta r)], \text{ and}$$

$$G_{j,a_c<r<a} = \text{sign}(E-V_2)B[J_{j+1/2}(\beta r) + B'Y_{j-1/2}(\beta r)], \tag{75}$$

where $$\beta = \frac{|E - V_2|}{v_F}$$

is the wave number in the region controlled by the potential imposed by the outer electrode. A, B, B' and C are constants to be determined. At the boundaries of the regions, where $r=a_c$ and r=a, both components must be continuous; in other words, F/G must be continuous. Assuming E>0, the phase shifts, $\delta_j$, of the partial waves, can be solved as:

$$\delta_j = \arctan\left(\frac{J_{j+1/2}(\beta a)J_{j-1/2}(ka) + B'J_{j-1/2}(ka)Y_{j+1/2}(\beta a) - \zeta_2 J_{j-1/2}(\beta a)J_{j-1/2}(ka) - \zeta_2 B'J_{j+1/2}(ka)Y_{j-1/2}(\beta a)}{J_{j+1/2}(\beta a)Y_{j-1/2}(ka) + B'Y_{j-1/2}(ka)Y_{j+1/2}(\beta a) - \zeta_2 J_{j-1/2}(\beta a)Y_{j+1/2}(ka) - \zeta_2 B'Y_{j+1/2}(ka)Y_{j-1/2}(\beta a)}\right), \tag{76}$$

where B' is given as:

$$B' = \frac{\zeta_1 \zeta_2 J_{j-1/2}(\alpha a_c)J_{j+1/2}(\beta a_c) - J_{j+1/2}(\alpha a_c)J_{j-1/2}(\beta a_c)}{J_{j+1/2}(\alpha a_c)Y_{j-1/2}(\beta a_c) - \zeta_1 \zeta_2 J_{j-1/2}(\alpha a_c)Y_{j+1/2}(\beta a_c)}, \tag{77}$$

and $\zeta_1 = \text{sign}(E-V_1)$, $\zeta_2 = \text{sign}(E-V_2)$. These expressions make clear that when the energy of an electron in the graphene 2DEG is lower than the imposed potential barrier, instead of an exponentially decaying solution as in normal 2DEG, the electron "converts" to a hole, in a particular scenario that is unique to Dirac electrons in graphene.

Figure 16:
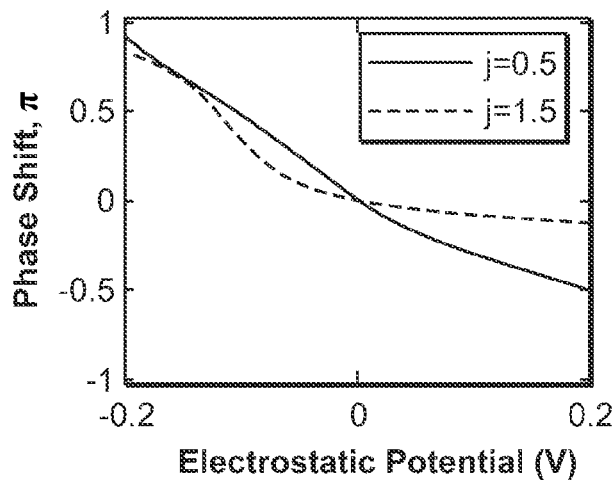
FIG. 16 is a plot of the phase shift, for each of the first two partial waves of an electron wave, as a function of imposed potential, in a graphene sheet in which the electron wave is traveling.

With this methodology, electrostatic potential barriers as well as electrostatic potential wells can be imposed to produce requisite phase shifts on the partial waves of electron matter waves in graphene. An example of such is demonstrated in the plot of FIG. 16. In this example, the electron energy for minimum scattering is chosen to be 100 meV, and the radius of the potential region is set to be 9 nm. As shown in the plots, electrostatic potential wells "pull in" partial waves while electrostatic potential barriers "push out" partial waves, and both wells and barriers have stronger effects on the lower order partial waves relative to higher order partial waves. This is expected as the partial waves remain the features of the Bessel functions in spite of the two-component form.

Following the approach given above for 2DEG environments, the cloaking parameters can be solved here to determine the potentials to be imposed on graphene, by enforcing voltages that cause the contributions from the first two partial waves of the charge carrier matter wave to vanish. First a prespecified energy for which charge carrier mobility is to be maximized is selected, and then the corresponding electron wave number is calculated as in the 3D environment. Now knowing the prespecified Fermi level energy at which a mobility peak is desired and the corresponding electron wave number, the size of the gating electrode region is designed such that the condition ka≤1 is satisfied. For the graphene 2DEG, the value of the extent, a, is theoretically the range of the electrostatic potential that is imposed by application of a voltage at an electrode. But in practice, this extent can be considered to be the same as the physical radius of the electrode, except for a small electrostatic smearing, under conditions that the free charge carrier concentration in the graphene is sufficiently large to screen the electrostatic potential and thereby prevent the potential from spreading significantly. Therefore, in making this determination, the extent, a, can be set as the radius of the electrode, e.g., outer radius of the example core-shell electrode configuration in FIG. 12.

With this electrode geometry specified, all that remains is determination of the electrode voltages that produce the desired electrostatic potential in the material. To make this determination, for the example electrodes of FIG. 12, candidate values for the voltages on the inner and outer electrodes are swept along opposite directions, and there are identified those values that make the phase shifts of the lowest two partial waves equal to π or a multiple of π. The phase shifts are determined based on Expressions (76) and (77). The intersection generates the solution of the voltages that produce the desired cloaking potential at the prespecified energy.

Figure 17:
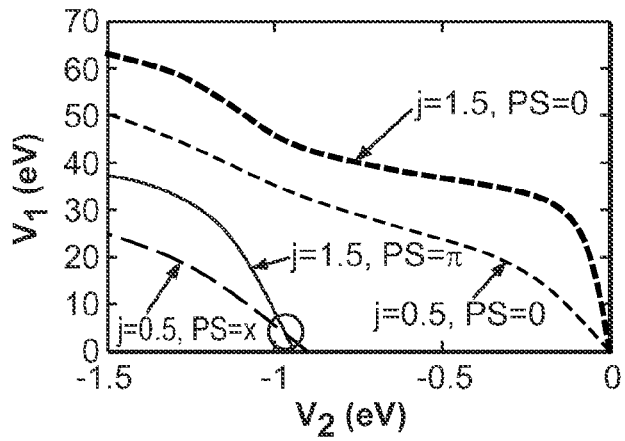
FIG. 17 is a plot of the voltages of the two electrodes of FIG. 12 that cause the phase shifts of the two lowest-order partial waves of an electron wave traveling in a graphene sheet on which the electrodes are disposed, to be 0 or $\pi$.

An example of this analysis is shown in the plot of FIG. 17. In this example, a cloaking energy of 100 meV is preselected as that incident electron energy for which the scattering rate is to be minimized. For the example arrangement of concentric electrodes shown in FIG. 12, an inner electrode radius, $a_c$, of 2 nm and an outer electrode radius, a, of 4 nm is prescribed. Then various combinations of the electrode voltages $V_1$ and $V_2$ are considered to determine that combination of applied voltages that causes the phase shifts of the two lowest-order partial waves of the electron matter wave to be 0 or π, or a multiple of π. In the plot of FIG. 17 there are shown the voltages that cause the phase shifts of the two lowest-order partial waves of the electron matter wave to be 0 or π. The intersection of those values, which is marked in the plot by the dashed circle, indicates the solution for making both phase shifts π at the same time. This example solution causes the two lowest-order partial waves to the total scattering width vanish. The voltages that achieve this condition are an inner electrode voltage of $V_1$=128 meV and an outer electrode voltage of $V_2$=−0.969 eV.

Figure 18:
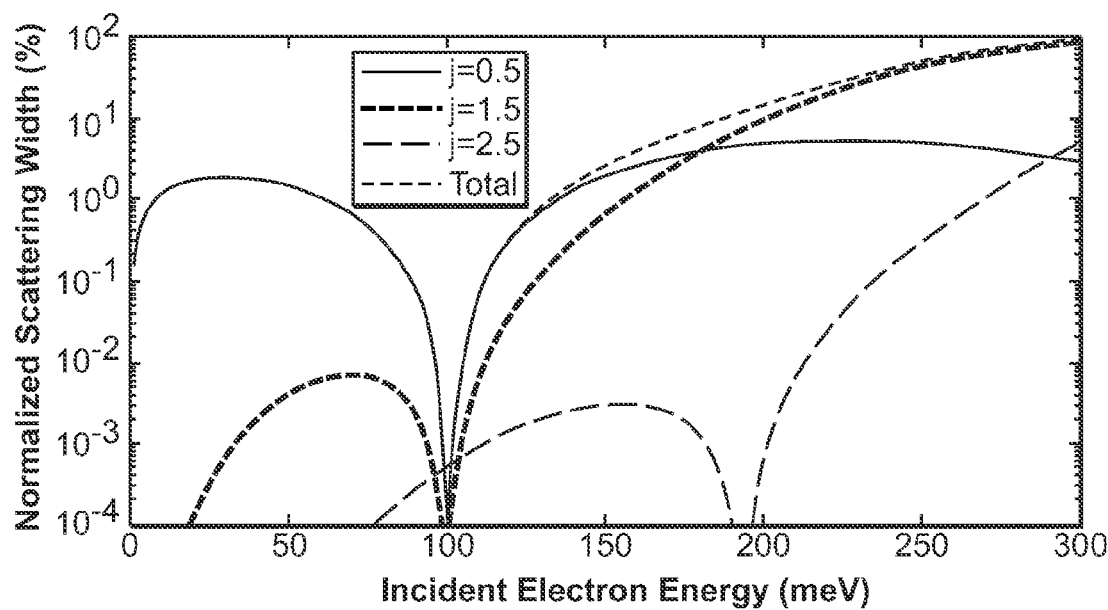
FIG. 18 is a plot of scattering width as a function of incident electron energy for the partial waves of j=0.5, 1.5, and 2.5 for the electrode voltages in the plot of FIG. 17 that cause the phase-shifts of these partial waves to be $\pi$.

FIG. 18 is a plot of the scattering width as a function of incident electron energy for the partial waves of j=0.5, 1.5, and 2.5 for these design values. The plotted scattering widths are normalized to the physical width of the cloaked region. At the prespecified cloaking energy of 100 meV, the scattering width is reduced to less than about 0.1% of the physical width of the scattering region, that is, the physical width of the electrodes.

Figure 19:
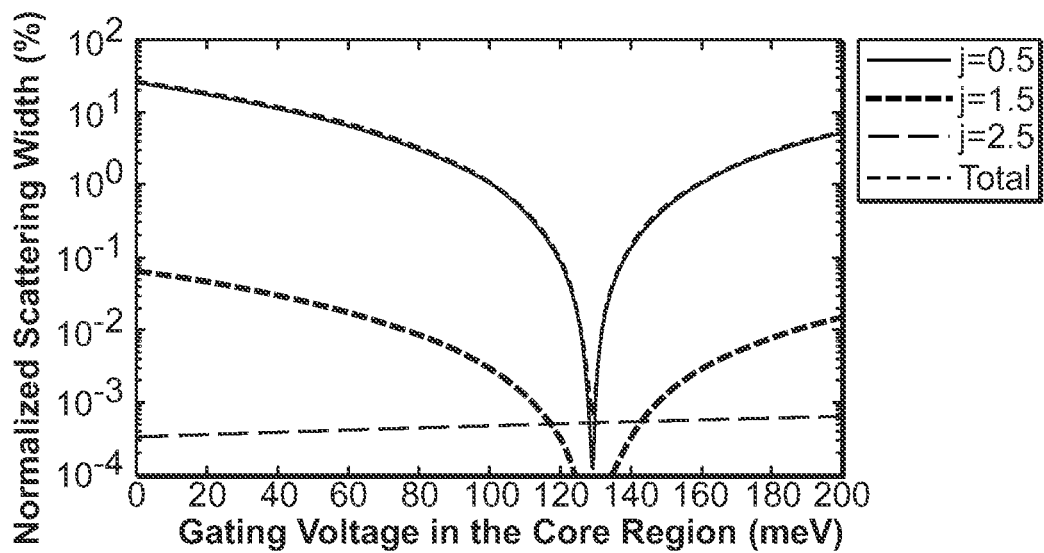
FIG. 19 is a plot of scattering width as a function of voltage on the inner electrode in the electrode arrangement of FIG. 12 for the first three partial waves of an electron wave traveling through a graphene sheet on which the electrode arrangement is disposed.

As explained above, to vary the incident energy of charge carriers in a 2DEG environment, the Fermi level of the 2DEG is adjusted, e.g., by doping the 2DEG environment with scattering centers that are designed based on the methodology given above, or alternatively, the voltage on one or more electrodes is adjusted or switched to change the electrostatic scattering potential in the region of the electrodes. One or both of the electrode voltages, e.g., $V_1$ and $V_2$ of the concentric electrode arrangement of FIG. 12, can be adjusted to correspondingly change energy of the incident electrons, or a separate control electrode can be provided for such. For example, in the concentric electrode arrangement of FIG. 12 as applied to a graphene 2DEG, it can be chosen to hold fixed one of the prespecified applied voltages, e.g., $V_2$, and to adjust the other applied voltage, $V_1$, for controlling the mobility of charge carriers in the graphene 2DEG environment, in the manner of a switch, by controlling the applied voltage, $V_1$. FIG. 19 is a plot of the resulting scattering width of the graphene 2DEG as a function of the gating voltage, $V_1$, imposed by the planar core electrode region, i.e., the inner electrode. At the prespecified design voltage of $V_1$=128 meV, there is obtained the requisite phase shifts of 0, or a multiple of π, of the partial waves of the electron matter wave, to minimize the scattering width and maximize the mobility of electrons in the graphene 2DEG at that voltage.

Figure 20A:
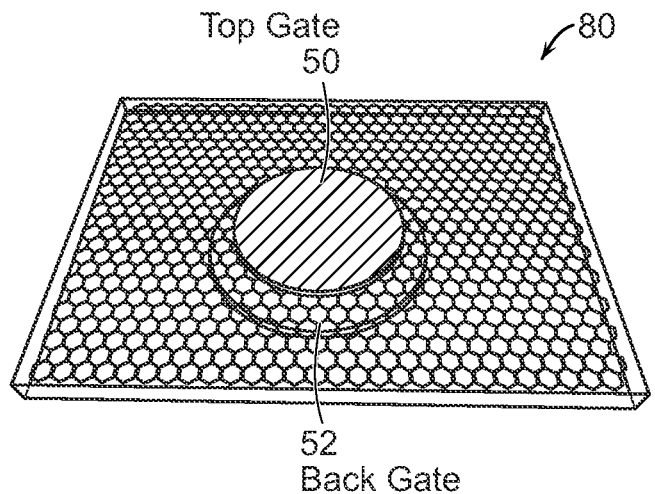
FIG. 20A is a schematic perspective view of a graphene sheet on which the electrode arrangement of FIG. 12 is configured with a top gate and a back gate.

The 2DEG scattering width control can be imposed by any convenient physical implementation, such as the concentric electrodes shown in FIG. 12. For graphene and other thin materials and structures that provide a 2DEG environment within the material itself, the material can be provided disposed on a substrate or other supporting structure, can be supported as a free-standing membrane, or other suspended structure, or configured in any other suitable manner. For example, as shown in the schematic view of FIG. 20A, there is configured a graphene sheet 80 on which are disposed two planar concentric electrodes for imposing scattering width control on the graphene sheet. These electrodes are arranged in the configuration of FIG. 12, with an inner, core electrode 50 and an outer concentric electrode 52. In this example, the inner electrode 50 is arranged as a top gate, on a first surface of the graphene 80 and the outer electrode 52 is arranged as a back gate, on a second, opposing surface of the graphene 80.

Figure 20B:
FIG. 20B is an example electrostatic potential profile in the graphene sheet of FIG. 20A that can be imposed by application of voltages to the electrodes in FIG. 20A.

The electrostatic potential profile that these voltages generate in the graphene sheet 80 is given in FIG. 20B, with reference to the physical dimensions of the electrodes, with an outer electrode radius, a, and a core electrode radius, $a_c$, imposing an example of a potential barrier, $V_1$, in the inner region, and a potential well, $V_2$, in the outer region.

Figure 21A:
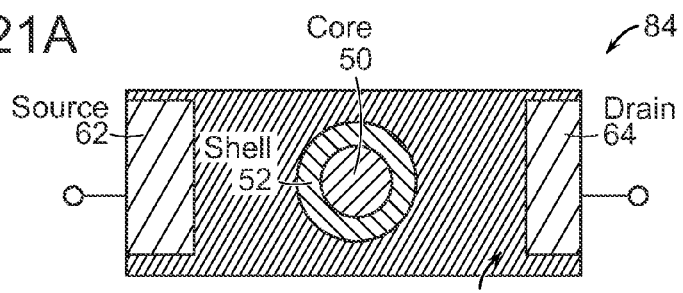
FIGS. 21A-C are schematic top down and side views of a 2DEG device employing the electrode arrangement of FIG. 12 on a free-standing 2D suspended membrane charge sheet.
Figure 21B:
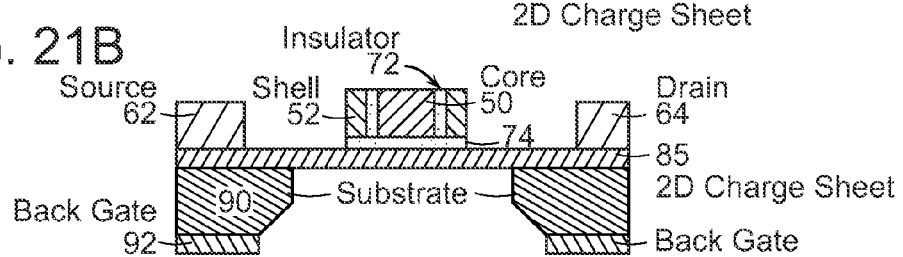

This arrangement of top and back gating, as well as the all-together gating of FIG. 12, can be implemented by, e.g., configuring the 2DEG material as a suspended free-standing membrane. An example of such is demonstrated in FIGS. 21A-C for implementing an example 2DEG switch. As shown in FIGS. 21A-B, such a device 84 is provided with a 2D charge sheet material 85, such as a graphene layer, on a surface of which is provided a selected electrode arrangement, such as the planar core-shell electrode arrangement described above. A core electrode 50 is laterally separated from an outer shell electrode 52 by an insulator 72. Source and drain regions 62, 64, are provided for device operation.

Figure 21C:
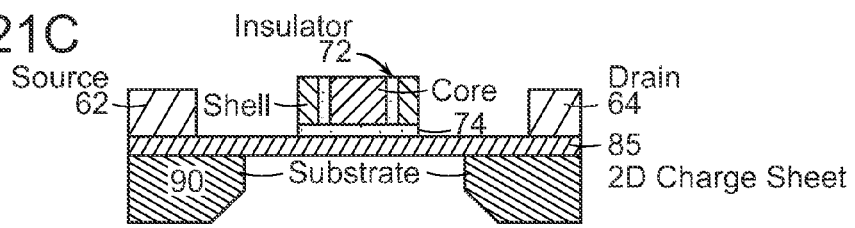

As shown in FIGS. 21B-21C, the charge sheet material 85 is in this example disposed as a membrane that is supported at membrane edges by an underlying support structure such as a substrate 90. In these views, there is shown an insulator 74 disposed on the surface of the sheet 85 underlying the electrodes. This insulator can be provided as a blanket coating the sheet or an island under the electrodes. The graphene layer surface is functionalized as-needed to enable formation of an insulating material on the surface. A back gate 92 can be provided on an opposing surface of the supporting substrate, or as in FIG. 21C, such can be omitted. With this suspension arrangement, the top and back gating of FIG. 20A can also be conveniently implemented, with the top gate on a first surface of the charge sheet membrane 85 and the back gate on the opposing membrane surface.

Figure 22A:
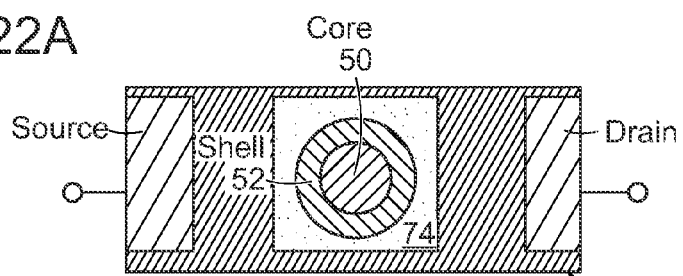
FIGS. 22A-C are schematic top down and side views of a 2DEG device employing the electrode arrangement of FIG. 12 on a 2D charge sheet that is supported by an underlying structure.
Figure 22B:
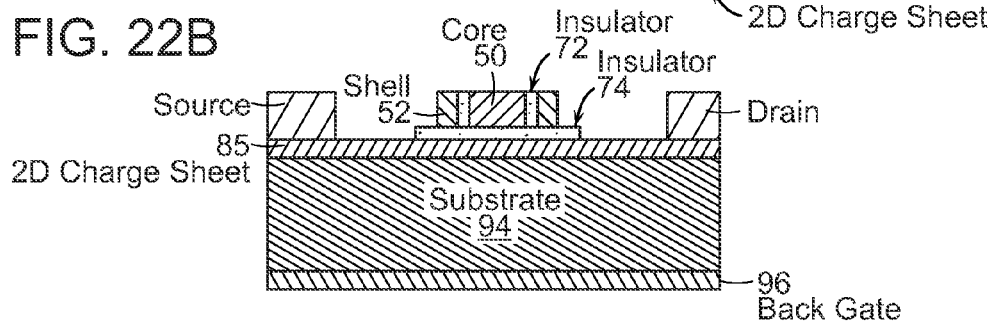
Figure 22C:
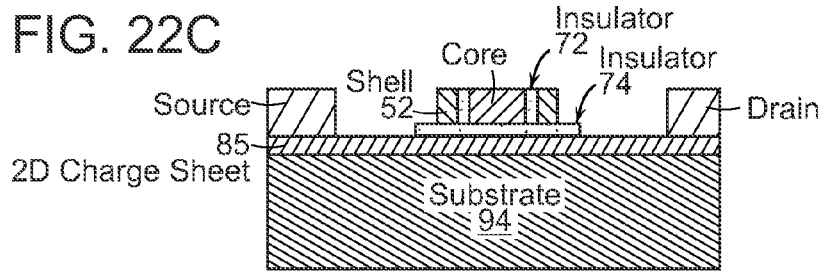

Referring to FIGS. 22A-C, if a suspended material is not required, then there can be configured a selected material and electrode arrangement on a fully supporting underlying substrate. As shown in FIG. 22A, the example electrode arrangement described above, with regard to FIG. 21A, can here be configured on a fully supporting substrate 94 as shown in FIG. 22B. A back gate 96 can be included on an opposing surface of the substrate, as shown in FIG. 22B, or omitted as in FIG. 22C.

Figure 23A:
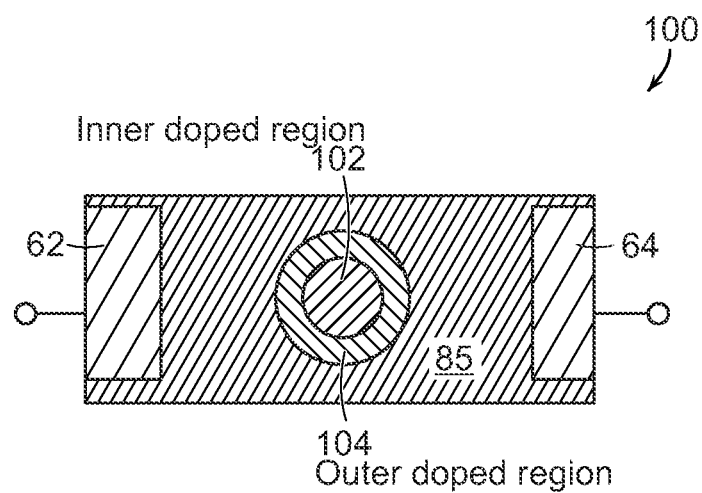
FIGS. 23A-23B are schematic top down and side views of a 2DEG device including impurity dopant centers disposed in a 2D charge sheet to impose potentials that control scattering width in the sheet.
Figure 23B:
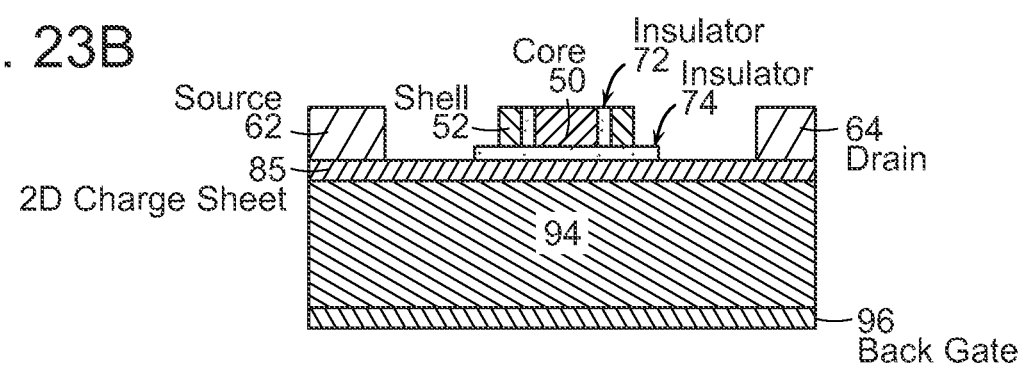

These example electrode arrangements on 2D charge sheets can be extended to parabolic-band 2DEG materials such as those described above, where convenient. In other words, heterostructures can be suspended as membranes including a 2D charge sheet. Further, for both atomic 2D charge sheets like graphene and parabolic-band 2DEG materials, there can be introduced impurity doping centers to impose selected design potentials for producing control of the scattering width in the materials. For example, as shown in FIGS. 23A-B, in a doped material device 100, there is provided a 2D charge sheet 85 and source and drain electrodes 62, 64, in the manner described above. In place of planar electrodes for imposing scattering width control, there is provided in the charge sheet an arrangement of one or more doped regions for imposing selected electrostatic potentials in the material. For example, considering the electrode arrangement of FIG. 12, here a first, core inner doped region 102 and second, outer doped region 104 are provided in the material, for producing the selected electrostatic potentials. This doping arrangement can be extended to multiple materials and to heterostructures that provide a 2DEG environment.

A wide range of 2DEG charge sheets are available for implementation of the scattering width control. Graphene, bilayer graphene, and multilayer graphene can be employed, as well as any material having a similarly atomic-scale structure, such as boron nitride, silicene, the 2D allotrope of silicon, germanene, the 2D allotrope of germanium, and transition metal dichalcogenides, such as $MoS_2$, $Bi_2Te_3$, and $Bi_2Se_3$, and other two-dimensional materials.

With these example materials and gating arrangements, a wide range of devices and sensors can be implemented. For both the parabolic 2DEG as well as graphene-like environments, such a device in general includes a charge sheet, which can be considered to be a thin layer of finite thickness, e.g., less than about 100 nm in thickness, including some concentration of electrical charge carriers, electrons or holes. One or more regions of the charge sheet are controlled to impose an electrostatic potential, relative to the potential of the charge carriers in the sheet, by external control. The region of electrostatic control, e.g., the extent of the planar electrodes in FIG. 12, is comparable to the thickness of the layer, and preferably is smaller than the width of the layer. With this arrangement, controllable devices can be implemented.

Indeed, both of the 2DEG environments described above as well as the three-dimensional environments first described can be configured in a wide range of controllable devices and structures. If scattering center particles are intentionally introduced to such a device material, those particles can be designed to provide electrical charge carrier donors or acceptors to the material, or can be provided to operate solely for imposing a localized electrostatic potential, with no charge carrier donation, as explained above.

In one example device, there is provided a filter. The filter operates to filter electrons or holes with respect to their energies in a selected environment. Those charge carriers having an energy that corresponds to a prespecified mobility peak energy or range of prespecified Fermi level energies for which the material is designed with scattering centers or with electrode gating, can conduct at a current level that is significantly higher than for those charge carriers at other energies, outside a prespecified energy window. The filtering energy range can be tuned by adjusting the prespecified mobility peak value and by adjusting the conditions of the environment.

In a further device example, described previously, there is provided a switch. The switch operates in the manner given above, with, e.g., external gating being controlled to adjust a localized potential relative to the charge carrier potential such that increased current can flow at a selected gate voltage. In the examples above, source and drain regions are provided for making electrical connections to complete a circuit. The on/off ratio of current flow through the switch can be tuned by tuning the sharpness in mobility peak and scattering reduction. This switching device is therefore different from conventional diodes and transistors in the sense that the device conductance exhibits a maximum only in a specific range of gate voltages or source-drain voltages. Further, the switching device can operate with very low voltages. The device can be operated as normally 'on' and switched 'off,' or normally 'off' and switched 'on.'

This device arrangement can further be employed as a memory storage device, or logic device, with a chain of devices providing a desired digital function based on the condition of each in a chain of switches. Alternatively, a chain or array of controlled electrostatic potential regions can be employed in a single device structure to implement a desired device logic. The state of the memory can be held fixed based on externally imposed potential. When the externally controlled potential is adjusted relative to the potential of charge carriers to enable significant current flow, then the state of the memory is "read."

All of the material configurations shown above to include one or more electrodes, or gates, as top and/or bottom gates, can be implemented as a sensing device. The electrodes at which a potential can be imposed by application of a voltage are in this scenario a voltage sensor. The electrical current through the device can be measured in a closed circuit as the sensing signal. In one example of such, the electrode or electrodes' sizes are selected for a prespecified voltage of interest that imposes a potential, relative to the charge carrier potential, which induces current flow through the device. In operation, the electrodes are exposed to an environment that influences the electrode voltage. The conditions of the environment thereby cause a corresponding degree of current flow. This external potential can be applied by any suitable means, and no particular mode is required. For example, the external potential can be applied optically, e.g., by one or more ambient or other sources of light, or can be applied chemically, in a liquid or gaseous environment. The device configuration is operable for any sensing environment that provides species which influence the voltage of the electrodes. The current flowing through the device is correlated with the electrostatic potential from the voltage imposed by the environment, to enable detection and analysis of species in the environment.

All of these sensing and device configurations can be fabricated and arranged in a monolithic microfabrication system, e.g., a microelectromechanical system, circuit, or platform. All of the 3D and 2D environments can be implemented by monolithic microfabrication. Monolithic integration of the environments with other devices and circuits enables production of complete device and sensor systems.

With this description, there is provided the ability to design metamaterials with specific characteristics and structures that produce prespecified electrical, thermal, and acoustic properties. For example, particles can be embedded in a host material, such as a semiconducting material, with characteristics that render the particles screened from the material's electrical charge carriers in a prespecified, tunable energy range of the charge carriers in the semiconductor. The total scattering cross section of the conduction carriers off of the particles can be reduced to, e.g., 0.01% of the physical cross section of the particles, using the design methodology given above. Many particle designs enable this condition, including, e.g., multi-layered particles and particles having anisotropic effective mass. With the design methodology above, the particles are cloaked, or invisible to, the electrical charge carriers, and this condition enables almost perfect transmission of the charge carriers at the prespecified charge carrier energy. Moreover, it is possible to tune the minimized scattering cross section energy range as well as the on-off scattering ratio.

A semiconductor with such cloaked ionized particles has higher electrical conductivity compared to conventionally-doped semiconductors, and thus there is enabled a range of semiconductor devices for which high carrier mobility is desired, such as transistors, diodes and MOSFETs, and where an alternative to, e.g., a modulation-doping strategy is desired. Further, with the design methodology above, there can be cloaked ionized core-shell particles that are provided in a host material for improving the thermoelectric figure of merit of the material largely by improving all the three parameters determining the figure of merit simultaneously.

The cloaking design methodology herein can further be implemented in a 2D geometry with proper gating that imposes voltage application as effective "2D-particles." Such gating enables the tuning of the width of a scattering minimum versus energy and the on-off scattering ratio of the scattering, to enable the realization of high-performance filtering and switching devices, with applications in quantum information storage, processing and communication. With the high mobility and high thermoelectric figure of merit that is enabled by the cloaking methodology, a wide range of applications can be addressed in a manner heretofore unachievable.

It is recognized that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:
1. An electrical mobility-controlled material comprising:
   a solid state host material having a controllable Fermi energy level and having free electrical charge carriers with a charge carrier mobility in the host material;
   a plurality of particles distributed in the host material;

at least one particle in the plurality of particles disposed in the host material with a radius, a, given by ka≤1, where k is free electrical charge carrier wave number, given as $$k = \frac{\sqrt{2m_c E_F}}{\hbar},$$

where $m_c$ is effective mass of the free electrical charge carriers in the host material, $E_F$ is a prespecified Fermi level energy at which a peak in free electrical charge carrier mobility in the host material is prespecified, and $\hbar$ is Planck's constant; and the at least one particle having an effective mass, $m_p$, in the host material given by $$-\frac{\hbar^2}{2m_p}\left(\frac{d^2}{dr^2} + \frac{2}{r}\frac{d}{dr}\right)R_l(r) + \frac{l(l+1)\hbar}{2m_p r^2} R_l(r) = ER_l(r)$$

where r is radial distance inside the particle, l has a value 0 for a first partial wave of an electrical charge carrier matter wave, l has a value 1 for a second partial wave of an electrical charge carrier matter wave, and E is an eigenvalue for an $R_l(r)$ eigenvector solution, so that a phase shift, $\delta_l$, of the $l^{th}$ partial waves meets the criterion of $$\delta_l = \arctan\left(\frac{kj'_l(ka) - \gamma_l j_l(ka)}{kn'_l(ka) - \gamma_l n_l(ka)}\right) = 0, n\pi$$

where l=0 and 1, $n\pi$ is a multiple, n, of $\pi$, k is the free electrical charge carrier wave number, a is the particle radius, and $j_l(ka)$ and $n_l(ka)$ are spherical Bessel functions of first and second kind as a function of radius, r, up to the particle radius, a, and $\gamma_l$ is a logarithmic derivative of the $l^{th}$ partial wave at the particle radius, where $$\gamma_l = \left.\frac{R'_l}{R_l}\right|_{r=a},$$

the at least one particle thereby minimizing scattering potential of the electrical charge carriers for the at least one prespecified Fermi level energy of peak charge carrier mobility in the host material, as the charge carriers conduct through the host material.

2. The material of claim 1 wherein the host material comprises a semiconducting material.

3. The material of claim 1 wherein the host material comprises a semiconducting polymer material.

4. The material of claim 1 wherein the host material is selected from the group consisting of II-VI materials and III-V materials.

5. The material of claim 1 wherein the host material is nonhomogeneous in material composition.

6. The material of claim 1 wherein the host material comprises a structure selected from the group of heterostructure and superlattice.

7. The material of claim 1 wherein the host material comprises a material configured in a thermoelectric device.

8. The material of claim 1 wherein the host material comprises a thermoelectric material selected from the group of SiGe alloys, half-heuslers, PbTe, PbSe, and SnTe.

9. The material of claim 1 wherein the host material has a thermoelectric figure of merit of at least about 0.5 at a temperature less than about 100 K.

10. The material of claim 1 wherein the host material is a nanowire.

11. The material of claim 1 wherein the host material is a membrane.

12. The material of claim 1 wherein the host material is a thin film disposed on a substrate.

13. The material of claim 1 wherein host material comprises a two-dimensional electron gas.

14. The material of claim 1 wherein the host material comprises a structure selected from the group of GaAs/AlGaAs interface, GaAs/InGaAs/GaAs quantum well, and $LaAlO_3/SrTiO_3$ interface.

15. The material of claim 1 wherein the host material comprises an atomic-layer material having an atomic thickness.

16. The material of claim 1 wherein the host material comprises a material selected from the group of graphene, multi-layer graphene, and few-layer graphene.

17. The material of claim 1 wherein the host material comprises a material selected from the group of silicene and $MoS_2$.

18. The material of claim 1 wherein the at least one particle has an electronic band structure that donates free electrical charge carriers to the host material.

19. The material of claim 1 wherein the at least one particle has an anisotropic effective mass.

20. The material of claim 1 wherein the at least one particle comprises a plurality of materials.

21. The material of claim 1 wherein the at least one particle is a spherical core-shell particle having a core region surrounded by at least one spherical shell region.

22. The material of claim 1 wherein the at least one particle is a spherical core-shell particle having a core region surrounded by a plurality of spherical shell regions.

23. The material of claim 1 wherein the at least one particle is a spherical core-shell particle having a core region with a core effective mass surrounded by at least one spherical shell region, each shell region having a shell effective mass that is different than the core effective mass.

24. The material of claim 1 wherein the at least one particle is a spherical core-shell particle having a core region that produces an electrostatic potential barrier in the host material with the core surrounded by a spherical shell region, the shell region producing an electrostatic potential well in the host material.

25. The material of claim 1 wherein the at least one particle is a spherical core-shell particle having a core region that produces an electrostatic potential well in the host material with the core surrounded by a spherical shell region, the shell region producing an electrostatic potential barrier in the host material.

26. The material of claim 1 wherein the at least one prespecified Fermi level energy is a prespecified range of Fermi level energies for peak mobility and is given as $E_{min} \pm 5k_B T$, where $E_{min}$ is at a center of the prespecified range, $k_B$ is the Boltzmann constant, and T is temperature.

27. The material of claim 1 further comprising at least one electrode disposed on the host material to impose a voltage on the host material.

28. The material of claim 1 wherein the solid state host material is connected to a plurality of Fermi level energy control electrodes, each control electrode connected between the host material and a circuit that controls the Fermi level energy of the host material.

29. The material of claim 1 wherein the solid state host material is connected to a plurality of Fermi level energy control electrodes each control electrode connected between the host material and a circuit that switches the Fermi level energy of the host material into and out of a prespecified Fermi level energy.

30. An electrical mobility-controlled material comprising:

a solid state host material having a thickness less than about 100 nm, the host material having a controllable Fermi energy level and having free electrical charge carriers with a charge carrier mobility in the host material;

at least one electrode disposed on the host material, the electrode having a radius, a, given by ka≤1, where k is charge carrier wave number, given as $$k = \frac{\sqrt{2m_c E_F}}{\hbar},$$

$m_c$ is effective mass of the free electrical charge carriers in the host material, $E_F$ is a prespecified Fermi level energy at which a peak in free electrical charge carrier mobility in the host material is prespecified, and $\hbar$ is Planck's constant; and the electrode being connected to impose on the host material a voltage, $V_{min}$, given by:

$$\rho^2 \frac{\partial^2}{\partial \rho^2} R_m(\rho) + \rho \frac{\partial}{\partial \rho} R_m(\rho) + (\rho^2 - m^2) R_m(\rho) = 0$$

where ρ=kr with $$k = \frac{\sqrt{2m_c(E_F - V_{min})}}{\hbar},$$

r is radius, and $R_m(\rho)$ are radial wave functions, where m has a value 0 for a first partial wave of an electrical charge carrier matter wave, m has a value 1 for a second partial wave of an electrical charge carrier matter wave so that a phase shift, δm, of the $m^{th}$ partial waves of a free charge carrier matter wave in the host material meets a criterion of $$\delta_m = \arctan\left(\frac{kJ'_m(ka) - \gamma_m J_m(ka)}{kY'_m(ka) - \gamma_m Y_m(ka)}\right) = 0, n\pi$$

where m=0 and 1, nπ is a multiple, n, of π, $$k = \frac{\sqrt{2m_c(E_F - V_{min})}}{\hbar},$$

a is the electrode radius, $J_m(ka)$ and $Y_m(ka)$ are radial Bessel functions of first and second kind as a function of radius, r up to the electrode radius, a, and γm is a logarithmic derivative of the $m^{th}$ partial wave at the electrode radius, where $$\gamma_m = \left.\frac{R'_m}{R_m}\right|_{r=a}$$

the electrode voltage $V_{min}$, thereby producing an electrostatic potential in the host material that minimizes scattering potential of the electrical charge carriers for the at least one prespecified Fermi level energy of peak charge carrier mobility in the host material, as the charge carriers conduct through the host material.

31. The material of claim 30 wherein the host material comprises a semiconducting material.

32. The material of claim 30 wherein the host material is selected from the group consisting of II-VI materials and III-V materials.

33. The material of claim 30 wherein the host material is nonhomogeneous in material composition.

34. The material of claim 30 wherein the host material comprises a structure selected from the group of heterostructure and superlattice.

35. The material of claim 30 wherein the host material is a nanowire.

36. The material of claim 30 wherein the host material is a membrane.

37. The material of claim 30 wherein the host material is a thin film disposed on a substrate.

38. The material of claim 30 wherein the host material is a heterogeneous structure.

39. The material of claim 30 wherein the host material comprises a structure selected from the group of GaAs/AlGaAs interface, GaAs/InGaAs/GaAs quantum well, and LaAlO$_3$/SrTiO$_3$ interface.

40. The material of claim 30 wherein the host material comprises a material selected from the group of graphene, multi-layer graphene, and few-layer graphene.

41. The material of claim 30 wherein the host material comprises a material selected from the group of silicene, germanene, boron nitride, and a transition metal dichalcogenide.

42. The material of claim 30 wherein the at least one electrode is substantially circular.

43. The material of claim 30 wherein the at least one electrode comprises a plurality of electrodes, each electrode connected to impose a different $V_{min}$ voltage on the host material simultaneously, the electrode voltages together producing an electrostatic potential in the host material that minimizes scattering of the electrical charge carriers for at least one prespecified Fermi level energy of the host material, as the charge carriers conduct through the host material.

44. The material of claim 30 wherein the at least one electrode comprises an inner circular electrode and an outer circular electrode encircling the inner circular electrode.

45. The material of claim 30 wherein the at least one electrode comprises an inner circular electrode connected to impose a first voltage, $V_1$, that produces an electrostatic potential barrier in the host material and an outer circular electrode encircling the inner circular electrode and connected to impose a second voltage, $V_2$, that produces an electrostatic potential well in the host material.

46. The material of claim 45 wherein one of the first and second voltages is held fixed and the other of the first and second voltages is externally controlled to switch the Fermi level energy of the host material into and out of the at least one prespecified Fermi level energy.

47. The material of claim 30 wherein, the electrode is connected to impose on the host material a range of control voltages, including the minimum scattering voltage, $V_{min}$, that switches the Fermi level energy of the host material into and out of the prespecified Fermi level energy of peak mobility.

48. The material of claim 30 wherein the at least one electrode comprises a plurality of electrodes in a distributed arrangement of electrodes.

49. The material of claim 30 wherein the at least one electrode comprises at least one electrode disposed on a first surface of the host material and at least one electrode disposed on a second, opposing surface of the host material.

50. The material of claim 30 wherein the at least one prespecified Fermi level energy is a prespecified range of Fermi energies for peak mobility and is given as $E_{min} \pm 5k_B T$, where $E_{min}$ is at a center of the prespecified range, $k_B$ is the Boltzmann constant, and T is temperature.

51. The material of claim 30 wherein the solid state host material is connected to a plurality of Fermi level energy control electrodes, each control electrode connected between the host material and a circuit that controls the Fermi level energy of the host material.

52. The material of claim 30 wherein the solid state host material is connected to a plurality of Fermi level energy control electrodes, each control electrode connected between the host material and a circuit that switches the Fermi level energy of the host material into and out of the prespecified Fermi level energy range of peak mobility.

\* \* \* \* \*